(12) United States Patent
Iwasa (10) Patent No.: US 7,687,393 B2
(45) Date of Patent: Mar. 30, 2010

(54) POLISHING COMPOSITION AND RINSE COMPOSITION

(75) Inventor: Shoji Iwasa, Ichinomiya (JP)

(73) Assignee: Fujimi Incorporated, Aichi (JP)

( * ) Notice: Subject to any disclaimer, the term of this patent is extended or adjusted under 35 U.S.C. 154(b) by 419 days.

(21) Appl. No.: 11/740,034

(22) Filed: Apr. 25, 2007

(65) Prior Publication Data

US 2007/0186486 A1     Aug. 16, 2007

Related U.S. Application Data

(62) Division of application No. 10/674,209, filed on Sep. 29, 2003, now Pat. No. 7,211,122.

(30) Foreign Application Priority Data

Sep. 30, 2002   (JP)   ............................. 2002-287979

(51) Int. Cl.
    H01L 21/4763   (2006.01)
(52) U.S. Cl. ...................... 438/631; 438/633
(58) Field of Classification Search .................. 438/631, 438/633; 257/E21.243
    See application file for complete search history.

(56) References Cited

U.S. PATENT DOCUMENTS

| | | | |
|---|---|---|---|
| 3,715,842 A | 2/1973 | Tredinnick et al. | 50/281 |
| 4,169,337 A | 10/1979 | Payne | 51/283 R |
| 4,462,188 A | 7/1984 | Payne | 51/283 |
| 4,588,421 A | 5/1986 | Payne | 51/308 |
| 5,073,591 A | 12/1991 | Tsaur | 524/460 |
| 5,352,277 A | 10/1994 | Sasaki | 106/6 |
| 6,258,140 B1 * | 7/2001 | Shemo et al. | 51/308 |
| 6,258,721 B1 | 7/2001 | Li et al. | 438/693 |
| 6,277,746 B1 * | 8/2001 | Skrovan et al. | 438/687 |
| 6,280,652 B1 | 8/2001 | Inoue et al. | 252/79.1 |
| 6,709,981 B2 | 3/2004 | Grabbe et al. | |
| 2001/0003672 A1 | 6/2001 | Inoue et al. | 438/690 |
| 2002/0052064 A1 | 5/2002 | Grabbe et al. | |
| 2002/0095872 A1 | 7/2002 | Tsuchiya et al. | 51/307 |
| 2002/0151252 A1 | 10/2002 | Kawase et al. | 451/36 |
| 2003/0004075 A1 | 1/2003 | Suto et al. | |

FOREIGN PATENT DOCUMENTS

| | | |
|---|---|---|
| JP | 63272459 | 9/1988 |
| JP | 11-116942 | 4/1999 |

* cited by examiner

*Primary Examiner*—William M. Brewster
(74) *Attorney, Agent, or Firm*—Vidas, Arrett & Steinkraus, P.A.

(57) ABSTRACT

A polishing composition for reducing the haze level of the surface of silicon wafers contains hydroxyethyl cellulose, polyethylene oxide, an alkaline compound, water, and silicon dioxide.

20 Claims, 1 Drawing Sheet

Fig.1

ND RINSE

POLISHING COMPOSITION AND RINSE COMPOSITION

CROSS-REFERENCE TO RELATED APPLICATIONS

This application is a divisional application claiming priority from allowed application Ser. No. 10/674,209 which in turn claims priority from Japanese patent application 2002-287979 having a priority date of Sep. 30, 2002. This application is related to but claims distinctly different embodiments than co-pending application Ser. No. 10/673,779 which in turn claims priority from Japanese patent application 2002-287448 having a priority date of Sep. 30, 2002. This application is also is related to but claims distinctly different embodiments than issued U.S. Pat. No. 7,052,522 which in turn claims priority from Japanese patent application 2002-287447 having a priority date of Sep. 30, 2002.

STATEMENT REGARDING FEDERALLY SPONSORED RESEARCH

Not Applicable

BACKGROUND OF THE INVENTION

1. Field of the Invention

In some embodiments this invention relates to a polishing composition and a rinse composition, and more specifically to a polishing composition and a rinse composition that are used in the treatment of silicon wafers to reduce the haze level of the surfaces of those silicon wafers.

2. Description of the Related Art

Highly integrated and high-speed ULSIs are manufactured in accordance to a fine-design rule. In order to satisfy the design rule, the focal depth of recent aligners is becoming shallower, and a flawless flat surface is required for silicon wafers for forming semiconductor devices. Haze level and light point defect (LPD) are used as indices representing surface characteristics (the degree of flaws and flatness).

Haze means milky-white clouding seen on the surface of a mirror-finished silicon wafer, and a haze level indicates the degree of the milky-white clouding. The clouding is caused by the diffused reflection of strong light radiated onto the silicon wafer, and can be visually observed.

LPD is the defect on the surface of a silicon wafer, and is caused by foreign substances adhered on the surface (hereafter also referred to as particles).

A polishing composition according to the first conventional method contains silicon dioxide, water, a water-soluble polymer (such as hydroxyethyl cellulose), a basic compound (such as ammonia), and a compound having 1 to 10 alcoholic hydroxyl groups (such as methanol).

Japanese Patent Laid-Open Publication No. 11-116942 discloses a polishing composition according to the second conventional method containing silicon dioxide, water, a water-soluble polymer, and a nitrogen-containing basic compound having 1 to 10 alcoholic hydroxyl groups (such as monoethanolamine).

By the action of the above-described water-soluble polymer, alcoholic compound, or nitrogen-containing basic compound, the quantity of particles adhered on the wafer surface are decreased, and the LPD is improved.

However, the polishing compositions according to the first and second conventional methods could not satisfactorily reduce the haze level on the surface. Therefore, there has been a demand for a treating method and a composition that can provide silicon wafers having surfaces of a reduced haze level.

BRIEF SUMMARY OF THE INVENTION

At least one embodiment of the invention is directed to providing a polishing composition, a rinse composition that can provide a silicon wafer having a surface with a reduced haze level and a method of treating a silicon wafer using that polishing composition and that rinse composition.

At least one embodiment of the invention is directed to a polishing composition used in a polishing process for reducing haze level of wafer surface. The polishing composition includes hydroxyethyl cellulose, polyethylene oxide compounded in said composition in a quantity larger than 0.005% by weight and smaller than 0.5% by weight, an alkaline compound, water, and silicon dioxide.

At least one embodiment of the invention is directed to a rinse composition used in the process for manufacturing silicon wafer having a surface with a reduced haze level. The rinse composition includes hydroxyethyl cellulose, polyethylene oxide compounded in said composition in a quantity larger than 0.005% by weight and smaller than 0.5% by weight, an alkaline compound, and water.

At least one embodiment of the invention is directed to a method of polishing for providing a silicon wafer having a surface with a reduced haze level. The method includes the steps of preparing a polishing composition containing hydroxyethyl cellulose, polyethylene oxide, an alkaline compound, water, and silicon dioxide, and contacting said polishing composition to the surface of said silicon wafer. Said polyethylene oxide is compounded in said polishing composition in a quantity larger than 0.005% by weight and smaller than 0.5% by weight.

At least one embodiment of the invention is directed to a method of rinsing for providing a silicon wafer having a surface with a reduced haze level. The method comprising the steps of preparing a rinse composition containing hydroxyethyl cellulose, polyethylene oxide, an alkaline compound, and water, and contacting said rinse composition to the surface of said silicon wafer after said surface has been polished. Said polyethylene oxide is compounded in said composition in a quantity larger than 0.005% by weight and smaller than 0.5% by weight.

At least one embodiment of the invention is directed to a method of treating a surface of a silicon wafer for providing a silicon wafer having a surface with a reduced haze level. The method comprising the steps of polishing the surface of said silicon wafer using a polishing composition containing hydroxyethyl cellulose, polyethylene oxide, an alkaline compound, water, and silicon dioxide. Said polyethylene oxide is compounded in said composition in a quantity larger than 0.005% by weight and smaller than 0.5% by weight. After polishing, a rinse composition is used to rinse the surface of said silicon wafer immediately after the completion of said polishing step, wherein said rinse composition contains hydroxyethyl cellulose, polyethylene oxide, an alkaline compound, and water The polyethylene oxide compounded in said rinse composition is in a quantity larger than 0-005% by weight and smaller than 0.5% by weight.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawing in which.

DETAILED DESCRIPTION OF THE PREFERRED EMBODIMENTS

At least one embodiment of the present invention is described as follows:

First, a method for manufacturing and treating a silicon wafer will be described. In the first step, a single-crystal silicon ingot is sliced to produce a wafer. After lapping the wafer, that wafer is formed to a predetermined shape. Etching is performed for removing the deteriorated layer caused by lapping on the surface layer of the wafer. Then the edges of the wafer are polished.

Furthermore, multistage polishing of the wafer is performed depending on the required quality of the silicon wafer. Specifically, in order to improve the flatness of the wafer surface, coarse polishing and fine polishing are performed. Thereafter, final polishing is performed in order to reduce (improve) the haze level of the wafer surface. Polishing may be performed in two stages, or may be broken up into four stages or more. The first embodiment relates to a polishing composition used in the polishing process for reducing the haze level. The polishing composition contains the following components A to E:

A: hydroxyethyl cellulose (HEC)
B: polyethylene oxide (PEO)
C: alkaline compound
D: water
E: silicon dioxide Component A, or HEC, has the function to reduce the haze level, and to improve the wettability of the wafer surface. The average molecular weight of HEC is preferably 300,000 to 3,000,000; more preferably 600,000 to 2,000,000; and most preferably 900,000 to 1,500,000. If the average molecular weight of NEC is lower than the above-described range, the effect of reducing the haze level is lowered. On the other hand, if the average molecular weight exceeds the above-described range, the polishing composition has an excessive viscosity and is gelated, making handling difficult.

The content of HEC in the polishing composition is preferably 0.01 to 3% by weight, more preferably 0.05 to 2% by weight, and most preferably 0.1 to 1% by weight. If the content of HEC is less than the above-described range, the effect of reducing the haze level is lowered. On the other hand, if the content of HEC exceeds the above-described range, the polishing composition has an excessive viscosity and is gelated, which tends to make handling difficult.

Component B, or PEO, has the function to cooperate with HEC to reduce the haze level. PEO is represented by general formula (1), and n in general formula (1) indicates the average degree of polymerization of ethylene oxide.

$$HO-(CH_2CH_2O)_n-CH_2CH_2OH \qquad (1)$$

The average molecular weight of PEO is normally 30,000 to 50,000,000; preferably 50,000 to 30,000,000; and more preferably 100,000 to 10,000,000. If the average molecular weight of PEO is less than 30,000, the effect of reducing the haze level is lowered. On the other hand, if the average molecular weight of PEO exceeds 50,000,000, the polishing composition will become a gel having a high viscosity, and handling will be difficult.

The content of PEO in the polishing composition is more than 0.005% by weight and less than 0.5% by weight, preferably more than 0.01% by weight and less than 0.4% by weight, and most preferably more than 0.03% by weight and less than 0.2%. If the content of PEO is 0.005% by weight or less, the effect of reducing the haze level is lowered. If the content of PEO is 0.5% by weight or more, the polishing composition will become a gel having a high viscosity, and handling will be difficult. Component C, or an alkaline compound, has the function to improve the polishing efficiency by corroding or etching the wafer surface.

As the alkaline compound, the following compounds can be used: inorganic alkaline compounds such as potassium hydroxide (PHA), sodium hydroxide (NHA), potassium hydrogen carbonate (PCAH), potassium carbonate (PCA), sodium hydrogen carbonate (NCAH), and sodium carbonate (NCA); ammonium salts such as ammonia (AM), tetrametyl ammonium hydroxide (TMAH), ammonium hydrogen carbonate (ACAS), and ammonium carbonate (ACA); and amines such as methylamine (MA), dimethylamine (DMA), trimethylamine (TMA), ethylamine (EA), diethylamine (DEA), triethylamine (TEA), ethylenediamine (EDA), monoethanolamine (MEA), N-(β-aminoethyl) ethanolamine (AEEA), hexamethylenediamine (HMDA), diethylenetriamine (DETA), triethylenetetramine (TETA), piperazine anhydride (PIZ), piperazine hexahydride, 1-(2-aminoethyl) piperazine (AEPIZ), and N-methylpiperazine (MPIZ). The alkaline compound can be used alone or in combination of two or more. The abbreviations indicated in parentheses will be used in the following description.

The preferred alkaline compounds are PHA, NHA, PCAH, PCA, NCAH, NCA, AM, TMAH, ACAH, ACA, PIZ, piperazine hexahydride, AEPIZ, and MPIZ, which have relatively low amine odor. PHA, NHA, AM, TMAH, PIZ, and piperazine hexahydride are preferred also because these compounds do not interfere with the function of the components of HEC and PEO.

The preferred content of Component C in the polishing composition is as follows:

When Component C is PHA, NHA, PCAH, PCA, NCAH, NCA, AM, TMAH, ACAH, ACA, MA, DMA, TMA, EA, DEA, TEA, EDA, MEA, AEEA, HMDA, DETA, or TETA, the content of Component C is preferably 0.02 to 4% by weight, more preferably 0.03 to 3% by weight, and most preferably 0.2 to 2% by weight.

When Component C is PIZ, AEPIZ, or MPIZ, the content of Component C is preferably 0.005 to 3% by weight, more preferably 0.01 to 2% by weight, and most preferably 0.1 to 0.5% by weight.

When Component C is piperazine hexahydride, the content is preferably 0.01 to 6% by weight, more preferably 0.02 to 3% by weight, and most preferably 0.2 to 1% by weight.

If the content of Component C is lower than the preferred range, the polishing acceleration function by Component C is weakened, and polishing speed is lowered. On the other hand, if the content of Component C exceeds the preferred range, the polishing composition is gelated, and since further polishing acceleration function cannot be obtained, the content of Component C exceeding the preferred range is uneconomical. Furthermore, since the etching power increases excessively, the wafer surface is roughened.

Component D, or water, has the function to disperse silicon dioxide, and to dissolve HEC, PEO, and the alkaline compound. In order not to interfere with the functions of other components A, B, C, and E, the water of a lowered impurity content is preferred, such as ion-exchanged water, pure water, ultra-pure water, and distilled water.

Component E, or silicon dioxide, has the function to mechanically polish the wafer surface. As the silicon dioxide, for example, colloidal silica (colloidal $SiO_2$) and fumed silica (fumed $SiO_2$) can be used. Of these, colloidal silica is preferred because it can polish the wafer surface with a high degree of precision.

The preferred particle diameters of Component E will be described. Two types of particle diameters are the average particle diameter $D_{SA}$ obtained on the basis of the specific surface area measured in accordance with the method for measuring the specific surface area of powder by a gas suction (BET method), and the average particle diameter $D_{N4}$ calculated from laser scattering.

When Component E is colloidal silica, the average particle diameter $D_{SA}$ is preferably 5 to 300 nm, more preferably 5 to 200 nm, and most preferably 5 to 120 nm; and the average particle diameter $D_{N4}$ is preferably 5 to 300 nm, more preferably 10 to 200 nm, and most preferably 15 to 150 nm If the average particle diameter of colloidal silica is smaller than the above-described range, sufficient polishing speed cannot be achieved. On the other hand, if the average particle diameter of colloidal silica exceeds the above-described range, the surface roughness of the silicon wafer tends to increase, and defects of the wafer surface such as scratches are easily produced to deteriorate the haze level.

When Component E is fumed silica, the average particle diameter $D_{SA}$ is preferably 10 to 300 nm, more preferably 10 to 200 nm, and most preferably 10 to 150 nm; and the average particle diameter $D_{N4}$ is preferably 30 to 500 nm, more preferably 40 to 400 nm, and most preferably 50 to 300 nm. If the average particle diameter of fumed silica is smaller than the above-described range, sufficient polishing speed cannot be achieved. On the other hand, if the average particle diameter of fumed silica exceeds the above-described range, the surface roughness of the silicon wafer tends to increase, and defects of the wafer surface such as scratches are easily produced to deteriorate the haze level.

Silicon dioxide may contain metallic impurities. The metallic impurities include transition metals, such as iron (Fe), nickel (Ni), and copper (Cu); calcium (Ca), magnesium (Mg), or the hydroxides and oxides thereof. The total content of the metallic impurities in silicon dioxide, as measured in a 20 wt-% aqueous solution of silicon dioxide is preferably 300 ppm or less, more preferably 100 ppm or less, and most preferably 0.3 ppm or less. If the content of metallic impurities exceeds 300 ppm, silicon wafers are easily contaminated by the metallic impurities.

The contamination of silicon wafers by metallic impurities means the adhesion of metallic impurities having a large diffusion coefficient such as copper, and the diffusion of the metallic impurities into the silicon wafers due to polishing. If a device is formed using a metal-contaminated silicon wafer, the metallic impurities diffused on the surface of or in the wafer may cause the defect of the semiconductor, such as short-circuiting and leakage.

The content of silicon dioxide in the polishing composition is preferably 0.1 to 40% by weight, more preferably 1 to 30% by weight, and most preferably 3 to 20% by weight. If the content of silicon dioxide is less than 0.1% by weight, sufficient polishing speed cannot be achieved. On the other hand, if the content of silicon dioxide exceeds 40% by weight, the viscosity of the polishing composition will excessively increase, the polishing composition will be gelated, and handling will become difficult.

The polishing composition may contain various additive components, such as chelating agents, surfactants, and preservatives. The content of the additive components is determined in accordance with the common practice of polishing compositions.

The pH of the polishing composition is preferably 9 to 12, and most preferably 10 to 11. If the pH of the polishing composition is lower than 9, the content of component C is low, and sufficient polishing speed cannot be achieved. On the other hand, if the pH of the polishing composition exceeds 12, the polishing composition may be gelated.

The polishing composition is prepared by adding Components A, B, C, and E to water, and stirring them using a blade-type stirrer, or dispersing using an ultrasonic dispersing apparatus. The order to add components A, B, C, and B to water is not limited.

In at least one embodiment, the polishing composition having a relatively high concentration is prepared in order to facilitate the storage and transportation of the polishing composition. The polishing composition is practically used in polishing processes after diluting. For diluting, the above-described impurity-reduced water is used. When a previously diluted polishing composition is prepared, the dilution ratio of the polishing composition is preferably 50 or less, more preferably 40 or less, and most preferably 20 or less. If the dilution ratio exceeds 50, the volume and weight of the diluted solution increase, and the transportation costs tend to be expensive.

Figure 1:
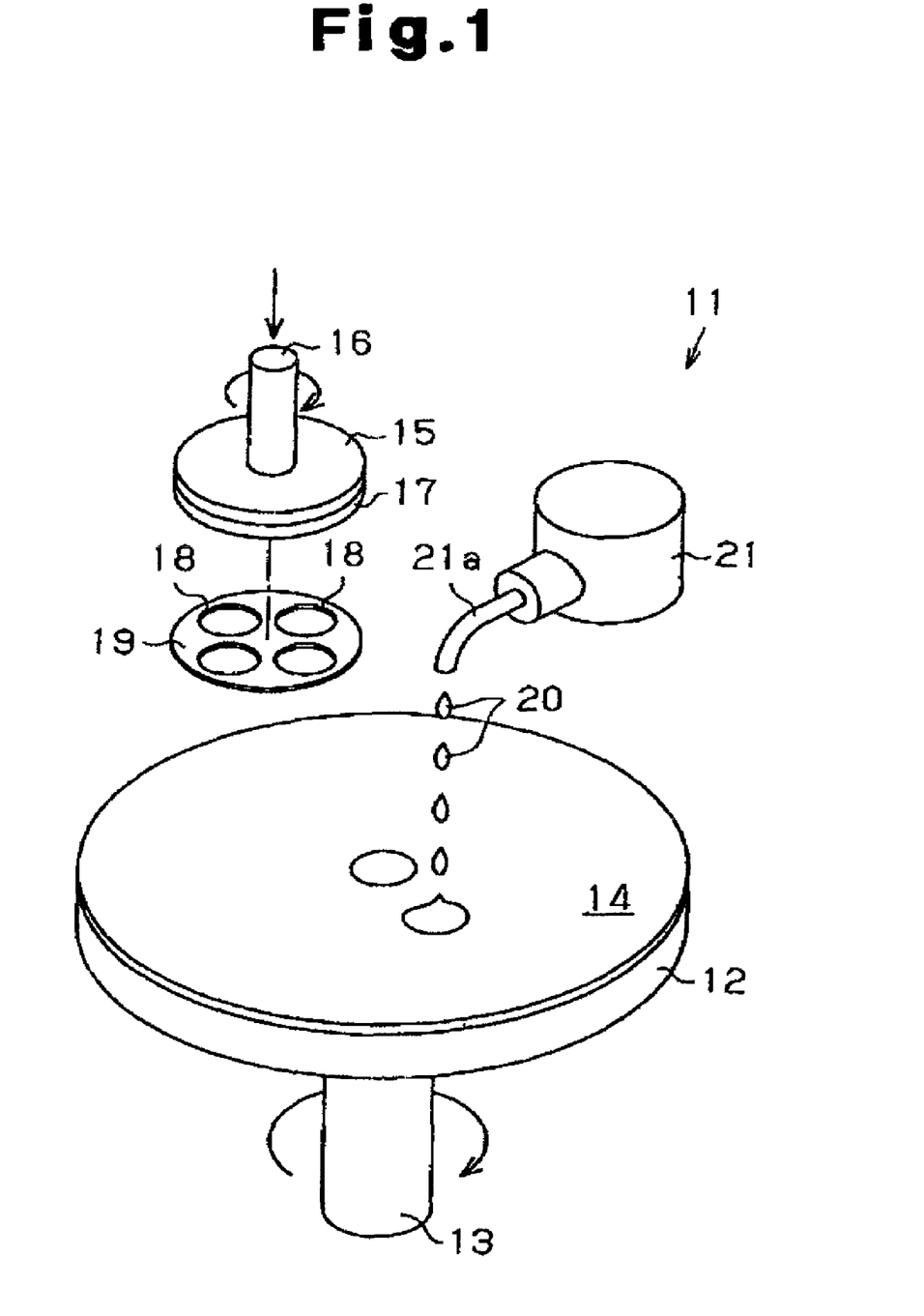
FIG. 1 is a perspective view of a polishing apparatus used in the polishing method and the rinsing method according to the present invention.

Next, the apparatus 11 for polishing silicon wafers will be described referring to FIG. 1.

The polishing apparatus 11 has a disc-type turntable 12 whereon a polishing pad 14 is bonded. The turntable 12 rotates around a first rotation shaft 13 installed on the lower center thereof. One or a plurality of disc-type wafer holders 15 (only one is shown in FIG. 1) are installed above the turntable 12, each wafer holder 15 is rotated by a second rotation shaft 16 fixed to the upper center thereof, and a disc-type ceramic plate 17 is fixed to the bottom surface.

To the bottom surface of the ceramic plate 17, a polyurethane sheet (not shown), and a disc-type wafer holding plate 19 having four wafer-holding holes 18 is detachably fixed. The polishing composition 20 is fed to the polishing pad 14 from the nozzle 21a of the feeder 21 installed above the turntable 12. When multistage polishing is performed, a plurality of respectively optimized polishing compositions are prepared for a plurality of polishing processes, and these polishing compositions are separately fed to the polishing pad 14 from a plurality of feeders 21.

Next, a method will be described for polishing a silicon wafer using the polishing composition.

When the wafer surface is polished in, for example, three stages, the silicon wafer is first held in the wafer holder 15 by, for example, suction while being accommodated in a wafer-holding hole 18 with the surface to be polished facing downward. While rotating the wafer holder 15 and the turntable 12, the polishing composition for first polishing is fed to the polishing pad 14 from the feeder 21. The wafer holder 15 is moved downward to push a silicon wafer against the polishing pad 14. Thus, the first polishing is performed on the wafer surface.

After the first polishing, second polishing is performed. The wafer holder 15 is once separated from the turntable 12. While feeding the composition for second polishing onto the polishing pad 14 from the feeder for the second polishing, the wafer holder 15 is moved downward to push a silicon wafer against the polishing pad 14. Thus, the second polishing is performed on the wafer surface.

After the second polishing, third polishing for lowering the haze level of the wafer surface is performed by using the polishing composition 20 according to the present invention. First, the wafer holder 15 is once separated from the turntable 12. While feeding the composition 20 for third polishing onto the polishing pad 14 from the feeder 21 for the third polishing, the wafer holder 15 is moved downward to push a silicon wafer against the polishing pad 14. Thus, the third polishing is performed on the wafer surface.

Although the case wherein one side of a silicon wafer is polished is described in the above description, the present invention can be applied to the case wherein both sides are simultaneously polished using a double-side polishing machine. According to the first embodiment, the following advantage can be obtained.

The polishing composition of the first embodiment contains HEC and PEO. By the synergic action of HEC and PEO, the surface roughness of wafers is efficiently reduced, and the haze level is reduced in comparison with conventional polishing compositions. The adhesion of particles, such as the components of the polishing composition and chips generated by polishing (abrasive shavings) onto the wafer surface is also inhibited, and the deterioration of LPD is prevented. Since the polishing composition contains an alkaline compound (Component C), the polishing speed is improved.

Next, at least one other embodiment of the invention will be described. This embodiment is related to a rinse composition used in the rinsing process performed after the polishing process for reducing the haze level of the wafer surface. The rinse composition contains the following components A to D:
A: HEC,
B: PEO,
C: alkaline compound, and
D: water.

The details of each component are as described for the above polishing composition.

Component C, or an alkaline compound, is used in order to adjust the pH of the rinse composition, and to reduce the haze level of the wafer surface. If a rapid change in pH occurs on the surface of a polished wafer, surface roughness is easily produced. Therefore, it is preferred that the pH of the rinse composition is almost the same level as the pH of the polishing composition. If the pH of the rinse composition is considerably lower than the pH of the polishing composition, the polishing composition remaining on the surface of the polishing pad reacts with the rinse composition on the wafer surface to form a gel. Since the removal of the gel from the wafer surface is difficult, and the gel causes the plugging of the polishing pad, the formation of the gel is not preferred. On the other hand, if the pH of the rinse composition is considerably higher than the pH of the polishing composition, the wafer surface is easily roughened.

The rinse composition is prepared by adding Components A, B, and C to water, and stirring using a blade-type stirrer or dispersing using an ultrasonic dispersing apparatus. Components A, B, and C can be added to water in any order.

The polishing composition having a relatively high concentration is prepared in order to facilitate the storage and transportation of the rinse composition. The rinse composition is practically used in rinse processes after diluting. For diluting, the above-described impurity-reduced water is used.

When a previously diluted rinse composition is manufactured, the dilution ratio of the rinse composition is preferably 100 or less, more preferably 80 or less, and most preferably 40 or less. If the dilution ratio exceeds 100, the volume and weight of the diluted solution increase, and the transportation costs tend to be expensive.

Next, a method for rinsing a silicon wafer using the above-described rinse composition will be described.

Immediately after the completion of polishing for reducing the haze level, the feeder 21 is replaced with a feeder for the rinse composition while maintaining the state wherein the wafer holder 15 is contacted to the turntable 12. The operating conditions of the polishing apparatus are switched to rinse conditions. The polishing composition remains on the wafer surface and the polishing pad 14. The polishing pad 14 is used as a pad for rinsing. The rinse composition is fed onto the polishing pad 14 from the feeder for the rinse composition. The wafer surface is rinsed by pushing the silicon wafer against the polishing pad 14.

Although the case wherein one side of a silicon wafer is rinsed is described in the above description, the present invention can be applied to the case wherein both sides are simultaneously rinsed using a double-side polishing machine. This allows the following advantage to be obtained:

The rinse composition of the second embodiment contains HEC and PEO.

In the rinsing method of the second embodiment, after the completion of polishing for reducing the haze level, the wafer surface whereon the polishing composition remains is rinsed using the rinse composition. Therefore a mixture of the polishing composition remaining on the wafer surface, the surface on and in the polishing pad, and the rinse composition is formed. Since the mixture contains a trace of silicon dioxide (Component E) derived from the polishing composition, the wafer surface is polished to some extent by silicon dioxide in the rinsing process. By the synergic action of HEC and PEO, the surface roughness of wafers is reduced, and the haze level is reduced in comparison with conventional rinse compositions. Since the adhesion of particles is also reduced, the LPD is improved.

According to the rinsing process of this embodiment, the polishing and rinsing of the wafer surface are sequentially performed. Therefore, the labor for once removing the silicon wafer after polishing the wafer surface from the wafer holding hole 18, and for mounting the silicon wafer to the rinsing apparatus can be eliminated, and the occurrence of etching or contamination of the wafer surface caused by the polishing composition can be prevented. The drying up of the wafer surface after polishing is also prevented, and the adhesion of silicon dioxide in the polishing composition on the wafer surface can be prevented. As a result, the LPD is improved. Since polishing and rinsing can be performed using the same apparatus, the time for treating the wafer surface can be reduced, and the costs for the polishing and rinsing processes can be reduced.

Other embodiments contemplated by the invention include:

After the completion of polishing or rinsing, the wafer surface may be scrub-cleaned using pure water. Scrub cleaning is a method for scrubbing the wafer surface using impurity-reduced water, such as pure water and ultra-pure water, with a sponge made of polyvinyl alcohol or the like.

The polishing composition and the rinse composition may contain hydrogen peroxide. The oxide film formed by hydrogen peroxide on the wafer surface prevents the adhesion of particles directly on the wafer surface, and improves the LPD.

The rinse composition may contain a trace of silicon dioxide (Component E). In this case, even if the polishing composition does not remain on the wafer surface or the surface of or in the polishing pad, the haze level is reduced by the rinsing treatment of the wafer surface, Next, the examples and comparative examples of the present invention will be described.

Referring now to table A there is shown Examples 1 to 26 and in Table B there are Comparative Examples 1 to 19.

—Polishing Composition—

The polishing composition of Example 1 was prepared by mixing HEC (Component A), PEO (Component B), a 29 wt-% aqueous solution of ammonia (Component C), ultra-pure water (Component D), and colloidal silica (Component E). The contents of HEC, PEO, and AM in the polishing composition are shown in Table A. The quantity of AM in the following description and tables is the quantity of a 29 wt-% aqueous solution of ammonia, and the quantity of TMAH is the quantity of a 25 wt-% aqueous solution of TMAH.

TABLE A

| Examples | \multicolumn{9}{c}{ingredient for reducing haze level} |
|---|---|---|---|---|---|---|---|---|---|
| | name | MW (×10³) | wt % | name | MW (×10³) | wt % | name | MW (×10³) | wt % |
| 1 | HEC | 1200 | 0.01 | PEO | 150~400 | 0.1 | — | | — |
| 2 | HEC | 1200 | 0.25 | PEO | 150~400 | 0.08 | — | | — |
| 3 | HEC | 1200 | 0.25 | PEO | 150~400 | 0.1 | — | | — |
| 4 | HEC | 1200 | 0.25 | PEO | 150~400 | 0.1 | EtOH | — | 2.0 |
| 5 | HEC | 1200 | 0.25 | PEO | 150~400 | 0.3 | — | | — |
| 6 | HEC | 1200 | 0.5 | PEO | 150~400 | 0.1 | — | | — |
| 7 | HEC | 1200 | 0.25 | PEO | 150~400 | 0.1 | — | | — |
| 8 | HEC | 1200 | 0.25 | PEO | 150~400 | 0.1 | — | | — |
| 9 | HEC | 1200 | 0.25 | PEO | 80~120 | 0.1 | — | | — |
| 10 | HEC | 1200 | 0.25 | PEO | 1700~2200 | 0.1 | — | | — |
| 11 | HEC | 1200 | 0.25 | PEO | 6000~8000 | 0.1 | — | | — |
| 12 | HEC | 1200 | 0.25 | PEO | 150~400 | 0.1 | PVA | — | 0.25 |
| 13 | HEC | 1200 | 0.25 | PEO | 150~400 | 0.1 | PEG | 0.6 | 0.1 |
| 14 | HEC | 1200 | 0.25 | PEO | 150~400 | 0.1 | PEG | 0.6 | 0.1 PVA 0.25 |
| 15 | HEC | 1200 | 0.25 | PEO | 150~400 | 0.1 | — | | — |
| 16 | HEC | 1200 | 0.25 | PEO | 150~400 | 0.1 | — | | — |
| 17 | HEC | 1200 | 0.25 | PEO | 150~400 | 0.1 | — | | — |
| 18 | HEC | 1200 | 0.25 | PEO | 150~400 | 0.1 | — | | — |
| 19 | HEC | 1200 | 0.25 | PEO | 150~400 | 0.1 | — | | — |
| 20 | HEC | 1200 | 0.25 | PEO | 150~400 | 0.1 | — | | — |
| 21 | HEC | 1200 | 0.25 | PEO | 150~400 | 0.1 | — | | — |
| 22 | HEC | 1200 | 0.25 | PEO | 150~400 | 0.1 | — | | — |
| 23 | HEC | 1200 | 0.25 | PEO | 150~400 | 0.1 | — | | — |
| 24 | HEC | 1200 | 0.25 | PEO | 150~400 | 0.1 | — | | — |
| 25 | HEC | 1200 | 0.25 | PEO | 150~400 | 0.1 | — | | — |
| 26 | HEC | 1200 | 0.25 | PEO | 150~400 | 0.3 | — | | — |

| Examples | ingredient for enhancing polishing rates | | | | | | | Haze level | LPD | Surface Condition |
|---|---|---|---|---|---|---|---|---|---|---|
| | name | wt % | name | wt % | name | wt % | name | wt % | | | |
| 1 | AM | 1.0 | — | | — | | — | | ◎ | △ | — |
| 2 | AM | 1.0 | — | | — | | — | | ◎ | △ | ○ |
| 3 | AM | 1.0 | — | | — | | — | | ☆ | △ | ◎ |
| 4 | AM | 1.0 | — | | — | | — | | ☆ | ○ | — |
| 5 | AM | 1.0 | — | | — | | — | | ◎ | △ | ◎ |
| 6 | AM | 1.0 | — | | — | | — | | ◎ | △ | — |
| 7 | AM | 1.0 | — | | — | | — | | ☆ | △ | — |
| 8 | AM | 1.0 | — | | — | | — | | ☆ | △ | — |
| 9 | AM | 1.0 | — | | — | | — | | ☆ | △ | — |
| 10 | AM | 1.0 | — | | — | | — | | ☆ | △ | ◎ |
| 11 | AM | 1.0 | — | | — | | — | | ☆ | △ | ◎ |
| 12 | AM | 1.0 | — | | — | | — | | ◎ | △ | ◎ |
| 13 | AM | 1.0 | — | | — | | — | | ☆ | △ | ◎ |
| 14 | PHA | 0.3 | — | | — | | — | | ◎ | △ | ◎ |
| 15 | TMAH | 0.5 | — | | — | | — | | ☆ | △ | — |
| 16 | PIZ | 0.3 | — | | — | | — | | ☆ | △ | — |
| 17 | AM | 0.5 | — | | — | | — | | ☆ | △ | — |
| 18 | AM | 0.5 | PHA | 0.15 | — | | — | | ☆ | △ | — |
| 19 | AM | 0.5 | TMAH | 0.25 | — | | — | | ☆ | △ | — |
| 20 | AM | 0.5 | PIZ | 0.15 | — | | — | | ☆ | △ | — |
| 21 | AM | 0.4 | PHA | 0.1 | TMAH | 0.2 | — | | ☆ | △ | — |
| 22 | AM | 0.4 | PHA | 0.1 | PIZ | 0.1 | — | | ☆ | △ | — |
| 23 | AM | 0.4 | TMAH | 0.2 | PIZ | 0.1 | — | | ☆ | △ | — |
| 24 | AM | 0.25 | PHA | 0.3 | TMAH | 0.1 | PIZ | 0.1 | ☆ | △ | — |
| 25 | AM | 1.0 | — | | — | | — | | ☆ | △ | — |
| 26 | AM | 1.0 | — | | — | | — | | ☆ | △ | — |

* AM: 29 wt % amonium solution

TABLE B

| Comparative Examples | ingredient for reducing haze level | | | | | | | | for enhancing polishing | | Haze level | LPD | Surface Condition |
|---|---|---|---|---|---|---|---|---|---|---|---|---|---|
| | name | MW (×10³) | wt % | name | MW (×10³) | wt % | name | MW (×10³) | wt % | name | wt % | | | |
| 1 | HEC | 1200 | 0.25 | EtOH | — | 2.0 | — | — | — | AM | 1.0 | ○ | ○ | — |
| 2 | GGG | — | 0.03 | — | — | — | — | — | — | CP | 0.2 | X | X | — |
| 3 | PAAM | — | 0.03 | — | — | — | — | — | — | CP | 0.2 | X | X | — |
| 4 | SPH | — | 0.03 | — | — | — | — | — | — | CP | 0.2 | X | X | — |
| 5 | HEC | 1200 | 0.25 | — | — | — | — | — | — | AM | 1.0 | ○ | Δ | X |
| 6 | PVA | — | 0.25 | — | — | — | — | — | — | AM | 1.0 | ○ | Δ | — |
| 7 | PEG | 0.6 | 0.1 | — | — | — | — | — | — | AM | 1.0 | Δ | X | — |
| 8 | PEG | 20 | 0.1 | — | — | — | — | — | — | AM | 1.0 | Δ | X | — |
| 9 | PEO | 150~400 | 0.1 | — | — | — | — | — | — | AM | 1.0 | ○ | X | — |
| 10 | HEC | 1200 | 0.25 | PVA | — | 0.25 | — | — | — | AM | 1.0 | ○ | Δ | X |
| 11 | HEC | 1200 | 0.25 | PEG | 0.6 | 0.1 | — | — | — | AM | 1.0 | ○ | Δ | X |
| 12 | HEC | 1200 | 0.25 | PEG | 20 | 0.1 | — | — | — | AM | 1.0 | ○ | X | X |
| 13 | HEC | 1200 | 0.25 | PEO | 150~400 | 0.003 | — | — | — | AM | 1.0 | ○ | Δ | Δ |
| 14 | HEC | 1200 | 0.25 | PEO | 150~400 | 0.5 | — | — | — | PHA | 0.3 | ○ | Δ | — |
| 15 | PVA | — | 0.25 | PEG | 0.6 | 0.1 | — | — | — | TMAH | 0.5 | ○ | X | — |
| 16 | PEG | 0.6 | 0.1 | PEO | 150~400 | 0.1 | — | — | — | PIZ | 0.3 | Δ | X | X |
| 17 | HEC | 1200 | 0.25 | PVA | — | 0.25 | PEG | 0.6 | 0.1 | AM | 0.5 | ○ | X | — |
| 18 | HEC | 1200 | 0.25 | — | — | — | — | — | — | AM | 0.5 | ○ | Δ | — |
| 19 | HEC | 1200 | 0.25 | — | — | — | — | — | — | AM | 0.5 | ◎ | Δ | — |

*AM: 29 wt % amonium solution

HEC and PEO are components to reduce the haze level, and ammonia is a component to accelerate polishing. The content of colloidal silica in the polishing composition was 10% by weight. The total content of iron, nickel, copper, and calcium in the 20 wt-% aqueous solution of colloidal silica was 20 ppb or less.

The average particle diameter $D_{SA}$ of colloidal silica measured using a FlowSorb II2300, the trade name of Micromeretics GmbH, was 35 nm. The average particle diameter $D_{N4}$ of colloidal silica measured using an N4 Plus Submicron Particle Sizer, the trade name of Beckman Coulter, Inc. was 70 nm.

In Examples 2 to 26 and Comparative Examples 1 to 19, polishing compositions were prepared in the same manner as in Example 1 except that the kinds and contents of the components to reduce the haze level and the components to accelerate polishing were changed as shown in Tables A and B.

Each polishing composition of Examples 1 to 26 and Comparative Examples 1 to 19 was diluted 20 times (volume ratio) with ultra-pure water, and the surface of a silicon wafer was polished using the diluted polishing composition under the following conditions:

Polishing apparatus: Single-side polishing apparatus (SPM-15: Fujikoshi Machinery Corp. with 4 wafer holders)
Articles to be polished: Four 6-inch silicon wafers/wafer holder
Load: 9.4 kPa
Turntable rotating speed: 30 rpm
Wafer holder rotating speed: 30 rpm
Polishing pad: Surfin 000 (suede type, manufactured by Fujimi Incorporated)
Feed speed of the composition: 500 m/min
Polishing time: 8 min
Temperature of the composition: 20° C.

As silicon wafers for testing Examples 1 to 24 and Comparative Examples 1 to 17, 6-inch silicon wafers (p-type, crystal orientation <100>, resistivity: less than 0.01 Ω·cm) from which the surface layers had been previously removed by 10 μm by polishing using a polishing composition (GLANZOX-1101, manufactured by Fujimi Incorporated) were used.

As silicon wafers for testing Example 25 and Comparative Example 18, 6-inch silicon wafers (p-type, crystal orientation <100>, resistivity: 0.01 Ω·cm or more and less than 0.1 Ω·cm) from which the surface layers had been previously removed by 10 μm by polishing using a polishing composition (GLANZOX-1101, manufactured by Fujimi Incorporated) were used.

As silicon wafers for testing Example 26 and Comparative Example 19, 6-inch silicon wafers (p-type, crystal orientation <100>, resistivity: 0.1 Ω·cm or more) from which the surface layers had been previously removed by 10 μm by polishing using a polishing composition (GLANZOX-1101, manufactured by Fujimi Incorporated) were used.

The silicon wafers after polishing were subjected to scrub cleaning for 10 seconds using pure water, and SC-1 cleaning. In SC-1 cleaning, a solution of ammonia (29 wt-% solution): hydrogen peroxide (31% solution):pure water=1:1:10 (volume ratio) was used.

The haze level (hereafter abbreviated as HL) and LPD of the silicon wafers after cleaning were evaluated. For Examples 2, 3, 5, and 10 to 14, and Comparative Examples 5, 10 to 13, and 16, the surface conditions were also evaluated. The results of evaluation are shown in Tables A and B.

The abbreviations in the tables are as follows:
Ethanol: EtOH
Guar gum: GGG
Polyacrylic amide: PAAM
Potassium chloride: CP
Disophylane: SPH
Polyvinyl alcohol (average degree of polymerization: 1,400; degree of saponification: 95%): PVA
Polyethylene glycol: PEG (1) Haze level: The haze levels of silicon wafers after cleaning were measured using an ANS-AWIS 3110 (trade name of ADE Company). The measured haze levels were evaluated by five scales of less than 0.05 ppm (☆). 0.05 ppm or more and less than 0.075 ppm (◎), 0.075 ppm or more and less than 0.1 ppm (○), 0.1 ppm or more and less than 0.2 ppm (Δ), and 0.2 ppm or more (X).

(2) LPD: The number of particles of a size of 0.1 μm or larger in silicon wafers after cleaning was counted using an AMS-AWIS 3110. The LPD was evaluated by three scales of less than 50 (○), 50 or more and less than 300 (Δ), and 300 or more (X).

(3) Surface conditions: The surface conditions of silicon wafers after cleaning were observed using an atomic force microscope (D 3000 manufactured by Digital Instruments). The observed range was a square area of a side of 10 μm, and ten areas were observed. The surface conditions were evaluated by four scales of very good without scratches (⊚), good with few scratches (○), poor with scratches (Δ), and very poor with many scratches (X).

In the polishing compositions of Examples 1 to 26 that contain both HEC and PEO, the evaluations of the haze level and LPD were fine. In the polishing compositions of Examples 2, 3, 5, and 10 to 14 that contained both HEC and PEO, the evaluations of the surface conditions were high, and it was seen that the formation of scratches was inhibited.

On the other hand, the evaluations of haze levels were poor in the polishing compositions of Comparative Examples 2 to 4, 6 to 8, and 15 that contained neither HEC nor PEO, the polishing composition of Comparative Examples 1, 5, 9-12, 16 and 17 that contained either one of HEC and PEO, the polishing composition of Comparative Example 13 of the LEO content of 0.005% by weight or less, and the polishing composition of Comparative Example 14 of the PEO content of 0.5% by weight or more. In Comparative Examples 5, 10 to 13, and 16, the evaluations of surface conditions were also poor. The haze levels of polishing compositions of Comparative Examples 18 and 19 that contained either one of HEC and PEO were poorer than the haze levels of Examples 25 and 26.

It was known from the above results, that the polishing compositions of Examples 1 to 26 that contained both HEC and PEO were superior to the polishing compositions of Comparative Examples 1 to 19 that lacked at least one of HEC and PEO.

Referring now to Table C there are shown Examples 27 to 52 and in Table D there are shown Comparative Examples 20 to 36. —Rinse Composition—

Rinse compositions of Example 27 was prepared by mixing HEC (Component A), PEO (Component B), AM (Component C), and ultra-pure water (Component D). HEC and PEO are the component to reduce the haze level, and Component C is a component to adjust pH. The contents of HEC, PEO, and AM in the rinse composition are shown in Table C.

The compositions of the rinse compositions of Examples 27 to 52 and Comparative Examples 20 to 36 are shown in Tables C and D. Each rinse composition of Examples 27 to 52 and Comparative Examples 20 to 36 was diluted 20 times with ultra-pure water.

TABLE C

| Examples | | MW (×10³) | wt % | | MW (×10³) | wt % | name | MW (×10³) | wt % | wt % |
|---|---|---|---|---|---|---|---|---|---|---|
| | | | | | ingredient for reducing haze level | | | | | |
| 27 | HEC | 1200 | 0.1 | PEO | 150~400 | 0.1 | — | | — | — |
| 28 | HEC | 1200 | 0.25 | PEO | 150~400 | 0.01 | — | | — | — |
| 29 | HEC | 1200 | 0.25 | PEO | 150~400 | 0.1 | — | | — | — |
| 30 | HEC | 1200 | 0.25 | PEO | 150~400 | 0.1 | EtOH | — | 2.0 | — |
| 31 | HEC | 1200 | 0.25 | PEO | 150~400 | 0.3 | — | | — | — |
| 32 | HEC | 1200 | 0.5 | PEO | 150~400 | 0.1 | — | | — | — |
| 33 | HEC | 1000 | 0.25 | PEO | 150~400 | 0.1 | — | | — | — |
| 34 | HEC | 1600 | 0.25 | PEO | 150~400 | 0.1 | — | | — | — |
| 35 | HEC | 1200 | 0.25 | PEO | 80~120 | 0.1 | — | | — | — |
| 36 | HEC | 1200 | 0.25 | PEO | 1700~2200 | 0.1 | — | | — | — |
| 37 | HEC | 1200 | 0.25 | PEO | 6000~8000 | 0.1 | — | | — | — |
| 38 | HEC | 1200 | 0.25 | PEO | 150~400 | 0.1 | PVA | — | 0.25 | — |
| 39 | HEC | 1200 | 0.25 | PEO | 150~400 | 0.1 | PEG | 0.6 | 0.1 | — |
| 40 | HEC | 1200 | 0.25 | PEO | 150~400 | 0.1 | PEG | 0.6 | 0.1 | PVA 0.25 |
| 41 | HEC | 1200 | 0.25 | PEO | 150~400 | 0.1 | — | | — | — |
| 42 | HEC | 1200 | 0.25 | PEO | 150~400 | 0.1 | — | | — | — |
| 43 | HEC | 1200 | 0.25 | PEO | 150~400 | 0.1 | — | | — | — |
| 44 | HEC | 1200 | 0.25 | PEO | 150~400 | 0.1 | — | | — | — |
| 45 | HEC | 1200 | 0.25 | PEO | 150~400 | 0.1 | — | | — | — |
| 46 | HEC | 1200 | 0.25 | PEO | 150~400 | 0.1 | — | | — | — |
| 47 | HEC | 1200 | 0.25 | PEO | 150~400 | 0.1 | — | | — | — |
| 48 | HEC | 1200 | 0.25 | PEO | 150~400 | 0.1 | — | | — | — |
| 49 | HEC | 1200 | 0.25 | PEO | 150~400 | 0.1 | — | | — | — |
| 50 | HEC | 1200 | 0.25 | PEO | 150~400 | 0.1 | — | | — | — |
| 51 | HEC | 1200 | 0.25 | PEO | 150~400 | 0.1 | — | | — | — |
| 52 | HEC | 1200 | 0.25 | PEO | 150~400 | 0.1 | — | | — | — |

| Examples | | for pH adjustment wt % | wt % | wt % | wt % | Haze level | LPD |
|---|---|---|---|---|---|---|---|
| 27 | AM | 1.0 | — | — | — | ⊚ | ○ |
| 28 | AM | 0.2 | — | — | — | ⊚ | ○ |
| 29 | AM | 0.2 | — | — | — | ⊚ | ○ |
| 30 | AM | 0.2 | — | — | — | ⊚ | ○ |
| 31 | AM | 1.0 | — | — | — | ⊚ | ○ |
| 32 | AM | 1.0 | — | — | — | ⊚ | ○ |
| 33 | AM | 1.0 | — | — | — | ⊚ | ○ |
| 34 | AM | 1.0 | — | — | — | ⊚ | ○ |

TABLE C-continued

| | | | | | | | | | | | |
|---|---|---|---|---|---|---|---|---|---|---|---|
| 35 | AM | 1.0 | — | | — | | — | | — | ◎ | ○ |
| 36 | AM | 1.0 | — | | — | | — | | — | ◎ | ○ |
| 37 | AM | 1.0 | — | | — | | — | | — | ◎ | ○ |
| 38 | AM | 1.0 | — | | — | | — | | — | ◎ | ○ |
| 39 | AM | 1.0 | — | | — | | — | | — | ◎ | ○ |
| 40 | AM | 1.0 | — | | — | | — | | — | ◎ | ○ |
| 41 | PHA | 0.3 | — | | — | | — | | — | ◎ | ○ |
| 42 | TMAH | 0.5 | — | | — | | — | | — | ◎ | ○ |
| 43 | PIZ | 0.3 | — | | — | | — | | — | ◎ | ○ |
| 44 | AM | 0.5 | PHA | 0.15 | — | | — | | — | ◎ | ○ |
| 45 | AM | 0.5 | TMAH | 0.25 | — | | — | | — | ◎ | ○ |
| 46 | AM | 0.5 | PIZ | 0.15 | — | | — | | — | ◎ | ○ |
| 47 | AM | 0.4 | PHA | 0.1 | TMAH | 0.2 | — | | — | ◎ | ○ |
| 48 | AM | 0.4 | PHA | 0.1 | PIZ | 0.1 | — | | — | ◎ | ○ |
| 49 | AM | 0.4 | TMAH | 0.2 | PIZ | 0.1 | — | | — | ◎ | ○ |
| 50 | AM | 0.25 | PHA | 0.1 | TMAH | 0.1 | PIZ | 0.1 | | ◎ | ○ |
| 51 | AM | 1.0 | — | | — | | — | | — | ◎ | ○ |
| 52 | AM | 1.0 | — | | — | | — | | — | ☆ | ○ |

* AM: 29 wt % amonium solution

At the same time of the completion of polishing using the polishing composition of Example 5 under the above-described polishing conditions, the operating conditions of the polishing apparatus were switched to the following rinsing conditions, and rinsing was performed using the diluted rinse composition.

<Rinsing Conditions>
Load: 2 kPa
Wafer holder rotation speed: 62 rpm
Feeding speed of the composition: 2,000 ml/min
Rinsing time: 30 seconds
Other conditions were the same as in the polishing conditions described above.

The rinsing tests for the rinse compositions of Example 51 and Comparative Example 35 were different from the tests for the rinse compositions of Examples 27 to 50 and Comparative Examples 20 to 34 only in the following aspects. Specifically the silicon wafers for the tests were 6-inch silicon wafers (p-type, crystal orientation <100>, resistivity: 0.01 Ω·cm or more and less than 0.1 Ω·cm) from which the surface layers had been previously removed by 10 μm by polishing using a polishing composition (GLANZOX-1101, manufactured by Fujimi Incorporated), and polished using the polishing composition of Comparative Example 19 before rinsing.

The rinsing tests for the rinse compositions of Example 52 and Comparative Example 36 were different from the tests for the rinse compositions of Examples 27 to 50 and Comparative

TABLE D

| Comparative Examples | | for reducing haze level | | | | | | for pH adjustment | | Haze level | LPD |
|---|---|---|---|---|---|---|---|---|---|---|---|
| | | MW (×10³) | wt % | | MW (×10³) | wt % | MW (×10³) | wt % | name | wt % | |
| 20 | HEC | 1200 | 0.25 | EtOH | — | 2.0 | — | | AM | 1.0 | ○ | ○ |
| 21 | HEC | 1200 | 0.25 | | — | | — | | AM | 1.0 | ○ | Δ |
| 22 | PVA | — | 0.25 | | — | | — | | AM | 1.0 | Δ | Δ |
| 23 | PEG | 0.6 | 0.1 | | — | | — | | AM | 1.0 | Δ | Δ |
| 24 | PEG | 20 | 0.1 | | — | | — | | AM | 1.0 | Δ | Δ |
| 25 | PEO | 150~400 | 0.1 | | — | | — | | AM | 1.0 | Δ | Δ |
| 26 | HEC | 1200 | 0.25 | PVA | — | 0.25 | — | | AM | 1.0 | Δ | Δ |
| 27 | HEC | 1200 | 0.25 | PEG | 0.6 | 0.1 | — | | AM | 1.0 | Δ | Δ |
| 28 | HEC | 1200 | 0.25 | PEG | 20 | 0.1 | — | | AM | 1.0 | Δ | Δ |
| 29 | HEC | 1200 | 0.25 | PEO | 150~400 | 0.003 | — | | AM | 1.0 | ○ | Δ |
| 30 | HEC | 1200 | 0.25 | PEO | 150~400 | 0.5 | — | | AM | 1.0 | ○ | Δ |
| 31 | PVA | — | 0.25 | PEG | 0.6 | 0.1 | — | | AM | 1.0 | ○ | Δ |
| 32 | PVA | — | 0.25 | PEO | 150~400 | 0.1 | — | | AM | 1.0 | Δ | Δ |
| 33 | PEG | 0.6 | 0.1 | PEO | 150~400 | 0.1 | — | | AM | 1.0 | Δ | Δ |
| 34 | HEC | 1200 | 0.25 | PVA | — | 0.25 | PEG | 0.6 | 0.1 | AM | 1.0 | Δ | Δ |
| 35 | HEC | 1200 | 0.1 | | — | | — | | AM | 1.0 | ○ | Δ |
| 36 | HEC | 1200 | 0.25 | | — | | — | | AM | 1.0 | ◎ | Δ |

* AM: 29 wt % amonium solution

As silicon wafers for testing the rinse compositions of Examples 27 to 50 and Comparative Examples 20 to 34, 6-inch silicon wafers (p-type, crystal orientation <100>, resistivity: less than 0.01 Ω·cm) from which the surface layers had been previously removed by 10 μm by polishing using a polishing composition (GLANZOX-1101, manufactured by Fujimi Incorporated) were used.

Examples 20 to 34 only in the following aspects. Specifically the silicon wafers for the tests were 6-inch silicon wafers (p-type, crystal orientation <100>, resistivity: 0.1Ω·cm or more) from which the surface layers had been previously removed by 10 μm by polishing using a polishing composition (GLANZOX-1101, manufactured by Fujimi Incorporated)

After rinsing using each rinse composition, scrub cleaning using pure water for 10 seconds, and SC-1 cleaning were performed. The silicon wafers after treatment were evaluated. The results of evaluation are shown in Tables C and D.

The evaluations of the haze level and LD were high in the rinse compositions of Examples 27 to 52 that contained both HEC and PEO.

On the other hand, the evaluations of the haze level were low in the rinse compositions of Comparative Examples 20, 21, 25 to 28, and 32 to 34 that contained either one of HEC or PEO; the rinse compositions of Comparative Examples 22 to 24 and 31 that contained neither HEC nor PEO; the rinse composition of Comparative Example 29 that contained 0.005% by weight or less PEC; the rinse composition of Comparative Example 30 that contained 0.5% by weight or more PEO; and Comparative Examples 35 and 36 that contained either one of HEC or PEO.

Referring now to tables E, F, G, G1-G12, and H there are shown additional data which was gathered according to the above mentioned methods. This additional data is so comprehensive as to be sufficiently representative of the entire possible range of permutations of proportional weight percentages and molecular weights of HEC, PEO, and AM contemplated by the above mentioned methods. This data proves that the inventive combinations of HEC and PEO have unexpected synergistic effects. These effects include their effectiveness in treating a silicon wafer surface to reduce haze level and use in a rinse composition in a manufacturing process of a silicon wafer with a wafer surface having a reduced haze level. The following explanation will explain how the permutations are controlled for HEC by molecular weight, HEC by weight percentage, PEO by molecular weight, PEO by weight percentage, and AM by weight percentage. Table G is an omnibus table and Tables G1-G12 each highlight particular portions of data from Table G which control for at least one of these permutations.

TABLE E

| Supplemental Examples | ingredient for reducing haze level | | | | | | ingredient for enhancing | | Haze level | LPD | Surface Condition |
|---|---|---|---|---|---|---|---|---|---|---|---|
| | name | MW ($\times 10^3$) | wt % | name | MW ($\times 10^3$) | wt % | name | wt % | | | |
| 1a | HEC | 1200 | 0.01 | PEO | 150~400 | 0.1 | AM | 1.0 | ◎ | Δ | — |
| 1 | HEC | 1200 | 0.1 | PEO | 150~400 | 0.1 | AM | 1.0 | ◎ | Δ | — |
| 2a | HEC | 1200 | 0.25 | PEO | 150~400 | 0.005 | AM | 1.0 | ◎ | Δ | ○ |
| 2 | HEC | 1200 | 0.25 | PEO | 150~400 | 0.01 | AM | 1.0 | ◎ | Δ | ○ |
| 3 | HEC | 1200 | 0.25 | PEO | 150~400 | 0.1 | AM | 1.0 | ☆ | Δ | ◎ |
| 5 | HEC | 1200 | 0.25 | PEO | 150~400 | 0.3 | AM | 1.0 | ◎ | Δ | ◎ |
| 5a | HEC | 1200 | 0.25 | PEO | 150~400 | 0.5 | AM | 1.0 | ◎ | Δ | — |
| 6 | HEC | 1200 | 0.5 | PEO | 150~400 | 0.1 | AM | 1.0 | ◎ | Δ | — |
| 6a | HEC | 1200 | 1 | PEO | 150~400 | 0.1 | AM | 1.0 | ◎ | Δ | — |

HEC: hydroxethyl cellulose
PEO: polyethylene oxide
AM: 29 wt % amonium solution

TABLE F

| Supplemental Comparative Examples | ingredient for reducing haze level | | | | | | ingredient for enhancing | | Haze level | LPD | Surface Condition |
|---|---|---|---|---|---|---|---|---|---|---|---|
| | name | MW ($\times 10^3$) | wt % | name | MW ($\times 10^3$) | wt % | name | wt % | | | |
| Comp. Ex. 5a | HEC | 1200 | 0.01 | — | | | AM | 1.0 | Δ | X | — |
| Comp. Ex. 5b | HEC | 1200 | 0.1 | — | | | AM | 1.0 | ○ | Δ | — |
| Comp. Ex. 5 | HEC | 1200 | 0.25 | — | | | AM | 1.0 | ○ | Δ | X |
| Comp. Ex. 5c | HEC | 1200 | 0.5 | — | | | AM | 1.0 | ○ | Δ | — |
| Comp. Ex. 5d | HEC | 1200 | 1 | — | | | AM | 1.0 | ○ | X | — |
| Comp. Ex. 9a | — | | | PEO | 150~400 | 0.005 | AM | 1.0 | X | X | — |
| Comp. Ex. 9b | — | | | PEO | 150~400 | 0.01 | AM | 1.0 | Δ | X | — |
| Comp. Ex. 9 | — | | | PEO | 150~400 | 0.1 | AM | 1.0 | ○ | X | — |
| Comp. Ex. 9c | — | | | PEO | 150~400 | 0.3 | AM | 1.0 | Δ | X | — |
| Comp. Ex. 9d | — | | | PEO | 150~400 | 0.5 | AM | 1.0 | X | X | — |

HEC: hydroxethyl cellulose
PEO: polyethylene oxide
AM: 29 wt % amonium solution

Ammonia weight % is controlled for in a range of between 0.02% and 4% by weight in Tables E, G, G1-G12, and H which provide sufficient representative data to show that ammonia within this range displays unexpected synergistic effects. Table H line 3 shows the lower end of this range for one possible combination of PEO and HEC does display unexpected synergistic effects. Table H line 4 shows the upper end of this range for one possible combination of PEO and HEC also displays unexpected synergistic effects. Tables E, G, G1-G12, and H show ammonia in a middle value in the range also displays unexpected synergistic effects for majority of the possible combinations of HEC and PEO. In addition, lines 2 and 5 in table H show that ammonia below this range (line 2) and above this range (line 5) do not displays unexpected synergistic effects.

TABLE G

Master Table

| Example# | HEC MW ($\times 10^3$) | HEC wt % | PEO MW ($\times 10^3$) | PEO wt % | Alkaline | Alkaline wt % | Haze Level | LPD | Surface Condition |
|---|---|---|---|---|---|---|---|---|---|
| 1 | 300 | 0.05 | 80~120 | 0.005 | AM | 1.0 | ◎ | Δ | ○ |
| 2 | 1,200 | 0.05 | 80~120 | 0.005 | AM | 1.0 | ◎ | Δ | — |
| 3 | 1,800 | 0.05 | 80~120 | 0.005 | AM | 1.0 | ◎ | Δ | ○ |
| 4 | 300 | 0.25 | 80~120 | 0.005 | AM | 1.0 | ◎ | Δ | — |
| 5 | 1,200 | 0.25 | 80~120 | 0.005 | AM | 1.0 | ◎ | Δ | ◎ |
| 6 | 1,800 | 0.25 | 80~120 | 0.005 | AM | 1.0 | ◎ | Δ | — |
| 7 | 300 | 2 | 80~120 | 0.005 | AM | 1.0 | ◎ | Δ | — |
| 8 | 1,200 | 2 | 80~120 | 0.005 | AM | 1.0 | ◎ | Δ | — |
| 9 | 1,800 | 2 | 80~120 | 0.005 | AM | 1.0 | ◎ | Δ | ○ |
| 10 | 300 | 0.05 | 150~400 | 0.005 | AM | 1.0 | ◎ | Δ | — |
| 11 | 1,200 | 0.05 | 150~400 | 0.005 | AM | 1.0 | ◎ | Δ | — |
| 12 | 1,800 | 0.05 | 150~400 | 0.005 | AM | 1.0 | ◎ | Δ | — |
| 13 | 300 | 0.25 | 150~400 | 0.005 | AM | 1.0 | ◎ | Δ | — |
| 14 | 1,200 | 0.25 | 150~400 | 0.005 | AM | 1.0 | ◎ | Δ | ○ |
| 15 | 1,800 | 0.25 | 150~400 | 0.005 | AM | 1.0 | ◎ | Δ | — |
| 16 | 300 | 2 | 150~400 | 0.005 | AM | 1.0 | ◎ | Δ | ○ |
| 17 | 1,200 | 2 | 150~400 | 0.005 | AM | 1.0 | ◎ | Δ | — |
| 18 | 1,800 | 2 | 150~400 | 0.005 | AM | 1.0 | ◎ | Δ | — |
| 19 | 300 | 0.05 | 6000~8000 | 0.005 | AM | 1.0 | ◎ | Δ | ○ |
| 20 | 1,200 | 0.05 | 6000~8000 | 0.005 | AM | 1.0 | ◎ | Δ | — |
| 21 | 1,800 | 0.05 | 6000~8000 | 0.005 | AM | 1.0 | ◎ | Δ | — |
| 22 | 300 | 0.25 | 6000~8000 | 0.005 | AM | 1.0 | ◎ | Δ | — |
| 23 | 1,200 | 0.25 | 6000~8000 | 0.005 | AM | 1.0 | ◎ | Δ | ◎ |
| 24 | 1,800 | 0.25 | 6000~8000 | 0.005 | AM | 1.0 | ◎ | Δ | — |
| 25 | 300 | 2 | 6000~8000 | 0.005 | AM | 1.0 | ◎ | Δ | — |
| 26 | 1,200 | 2 | 6000~8000 | 0.005 | AM | 1.0 | ◎ | Δ | — |
| 27 | 1,800 | 2 | 6000~8000 | 0.005 | AM | 1.0 | ☆ | Δ | ○ |
| 28 | 300 | 0.05 | 80~120 | 0.1 | AM | 1.0 | ☆ | Δ | — |
| 29 | 1,200 | 0.05 | 80~120 | 0.1 | AM | 1.0 | ☆ | Δ | — |
| 30 | 1,800 | 0.05 | 80~120 | 0.1 | AM | 1.0 | ◎ | Δ | — |
| 31 | 300 | 0.25 | 80~120 | 0.1 | AM | 1.0 | ◎ | Δ | ◎ |
| 32 | 1,200 | 0.25 | 80~120 | 0.1 | AM | 1.0 | ◎ | Δ | — |
| 33 | 1,800 | 0.25 | 80~120 | 0.1 | AM | 1.0 | ◎ | Δ | — |
| 34 | 300 | 2 | 80~120 | 0.1 | AM | 1.0 | ◎ | Δ | — |
| 35 | 1,200 | 2 | 80~120 | 0.1 | AM | 1.0 | ◎ | Δ | — |
| 36 | 1,800 | 2 | 80~120 | 0.1 | AM | 1.0 | ◎ | Δ | — |
| 37 | 300 | 0.05 | 150~400 | 0.1 | AM | 1.0 | ◎ | Δ | ◎ |
| 38 | 1,200 | 0.05 | 150~400 | 0.1 | AM | 1.0 | ◎ | Δ | — |
| 39 | 1,800 | 0.05 | 150~400 | 0.1 | AM | 1.0 | ◎ | Δ | — |
| 40 | 300 | 0.25 | 150~400 | 0.1 | AM | 1.0 | ◎ | Δ | — |
| 41 | 1,200 | 0.25 | 150~400 | 0.1 | AM | 1.0 | ◎ | Δ | ◎ |
| 42 | 1,800 | 0.25 | 150~400 | 0.1 | AM | 1.0 | ◎ | Δ | — |
| 43 | 300 | 2 | 150~400 | 0.1 | AM | 1.0 | ◎ | Δ | — |
| 44 | 1,200 | 2 | 150~400 | 0.1 | AM | 1.0 | ◎ | Δ | — |
| 45 | 1,800 | 2 | 150~400 | 0.1 | AM | 1.0 | ◎ | Δ | ◎ |
| 46 | 300 | 0.05 | 6000~8000 | 0.1 | AM | 1.0 | ◎ | Δ | — |
| 47 | 1,200 | 0.05 | 6000~8000 | 0.1 | AM | 1.0 | ◎ | Δ | ◎ |
| 48 | 1,800 | 0.05 | 6000~8000 | 0.1 | AM | 1.0 | ◎ | Δ | — |
| 49 | 300 | 0.25 | 6000~8000 | 0.1 | AM | 1.0 | ☆ | Δ | — |
| 50 | 1,200 | 0.25 | 6000~8000 | 0.1 | AM | 1.0 | ☆ | Δ | ◎ |
| 51 | 1,800 | 0.25 | 6000~8000 | 0.1 | AM | 1.0 | ☆ | Δ | — |
| 52 | 300 | 2 | 6000~8000 | 0.1 | AM | 1.0 | ◎ | Δ | — |
| 53 | 1,200 | 2 | 6000~8000 | 0.1 | AM | 1.0 | ◎ | Δ | ◎ |
| 54 | 1,800 | 2 | 6000~8000 | 0.1 | AM | 1.0 | ◎ | Δ | — |
| 55 | 300 | 0.05 | 80~120 | 0.5 | AM | 1.0 | ◎ | Δ | — |
| 56 | 1,200 | 0.05 | 80~120 | 0.5 | AM | 1.0 | ◎ | Δ | — |
| 57 | 1,800 | 0.05 | 80~120 | 0.5 | AM | 1.0 | ◎ | Δ | ○ |
| 58 | 300 | 0.25 | 80~120 | 0.5 | AM | 1.0 | ◎ | Δ | ○ |
| 59 | 1,200 | 0.25 | 80~120 | 0.5 | AM | 1.0 | ◎ | Δ | — |
| 60 | 1,800 | 0.25 | 80~120 | 0.5 | AM | 1.0 | ◎ | Δ | — |
| 61 | 300 | 2 | 80~120 | 0.5 | AM | 1.0 | ◎ | Δ | — |
| 62 | 1,200 | 2 | 80~120 | 0.5 | AM | 1.0 | ◎ | Δ | ○ |
| 63 | 1,800 | 2 | 80~120 | 0.5 | AM | 1.0 | ◎ | Δ | — |

TABLE G-continued

Master Table

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 64 | 300 | 0.05 | 150~400 | 0.5 | AM | 1.0 | ⊚ | △ | — |
| 65 | 1,200 | 0.05 | 150~400 | 0.5 | AM | 1.0 | ⊚ | △ | ⊚ |
| 66 | 1,800 | 0.05 | 150~400 | 0.5 | AM | 1.0 | ⊚ | △ | — |
| 67 | 300 | 0.25 | 150~400 | 0.5 | AM | 1.0 | ⊚ | △ | — |
| 68 | 1,200 | 0.25 | 150~400 | 0.5 | AM | 1.0 | ⊚ | △ | ⊚ |
| 69 | 1,800 | 0.25 | 150~400 | 0.5 | AM | 1.0 | ⊚ | △ | — |
| 70 | 300 | 2 | 150~400 | 0.5 | AM | 1.0 | ⊚ | △ | — |
| 71 | 1,200 | 2 | 150~400 | 0.5 | AM | 1.0 | ⊚ | △ | — |
| 72 | 1,800 | 2 | 150~400 | 0.5 | AM | 1.0 | ⊚ | △ | ○ |
| 73 | 300 | 0.05 | 6000~8000 | 0.5 | AM | 1.0 | ⊚ | △ | — |
| 74 | 1,200 | 0.05 | 6000~8000 | 0.5 | AM | 1.0 | ⊚ | △ | — |
| 75 | 1,800 | 0.05 | 6000~8000 | 0.5 | AM | 1.0 | ⊚ | △ | ○ |
| 76 | 300 | 0.25 | 6000~8000 | 0.5 | AM | 1.0 | ⊚ | △ | — |
| 77 | 1,200 | 0.25 | 6000~8000 | 0.5 | AM | 1.0 | ⊚ | △ | — |
| 78 | 1,800 | 0.25 | 6000~8000 | 0.5 | AM | 1.0 | ⊚ | △ | — |
| 79 | 300 | 2 | 6000~8000 | 0.5 | AM | 1.0 | ⊚ | △ | — |
| 80 | 1,200 | 2 | 6000~8000 | 0.5 | AM | 1.0 | ⊚ | △ | — |
| 81 | 1,800 | 2 | 6000~8000 | 0.5 | AM | 1.0 | ⊚ | △ | ○ |

TABLE G1

(HEC MW fixed at low end value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 1 | 300 | 0.05 | 80~120 | 0.005 | AM | 1.0 | ⊚ | △ | ○ |
| 4 | 300 | 0.25 | 80~120 | 0.005 | AM | 1.0 | ⊚ | △ | — |
| 7 | 300 | 2 | 80~120 | 0.005 | AM | 1.0 | ⊚ | △ | — |
| 10 | 300 | 0.05 | 150~400 | 0.005 | AM | 1.0 | ⊚ | △ | — |
| 13 | 300 | 0.25 | 150~400 | 0.005 | AM | 1.0 | ⊚ | △ | — |
| 16 | 300 | 2 | 150~400 | 0.005 | AM | 1.0 | ⊚ | △ | ○ |
| 19 | 300 | 0.05 | 6000~8000 | 0.005 | AM | 1.0 | ⊚ | △ | ○ |
| 22 | 300 | 0.25 | 6000~8000 | 0.005 | AM | 1.0 | ⊚ | △ | — |
| 25 | 300 | 2 | 6000~8000 | 0.005 | AM | 1.0 | ⊚ | △ | — |
| 28 | 300 | 0.05 | 80~120 | 0.1 | AM | 1.0 | ⊚ | △ | — |
| 31 | 300 | 0.25 | 80~120 | 0.1 | AM | 1.0 | ☆ | △ | ⊚ |
| 34 | 300 | 2 | 80~120 | 0.1 | AM | 1.0 | ⊚ | △ | — |
| 37 | 300 | 0.05 | 150~400 | 0.1 | AM | 1.0 | ⊚ | △ | ⊚ |
| 40 | 300 | 0.25 | 150~400 | 0.1 | AM | 1.0 | ☆ | △ | — |
| 43 | 300 | 2 | 150~400 | 0.1 | AM | 1.0 | ⊚ | △ | — |
| 46 | 300 | 0.05 | 6000~8000 | 0.1 | AM | 1.0 | ⊚ | △ | — |
| 49 | 300 | 0.25 | 6000~8000 | 0.1 | AM | 1.0 | ☆ | △ | — |
| 52 | 300 | 2 | 6000~8000 | 0.1 | AM | 1.0 | ⊚ | △ | — |
| 55 | 300 | 0.05 | 80~120 | 0.5 | AM | 1.0 | ⊚ | △ | — |
| 58 | 300 | 0.25 | 80~120 | 0.5 | AM | 1.0 | ⊚ | △ | ○ |
| 61 | 300 | 2 | 80~120 | 0.5 | AM | 1.0 | ⊚ | △ | — |
| 64 | 300 | 0.05 | 150~400 | 0.5 | AM | 1.0 | ⊚ | △ | — |
| 67 | 300 | 0.25 | 150~400 | 0.5 | AM | 1.0 | ⊚ | △ | — |
| 70 | 300 | 2 | 150~400 | 0.5 | AM | 1.0 | ⊚ | △ | — |
| 73 | 300 | 0.05 | 6000~8000 | 0.5 | AM | 1.0 | ⊚ | △ | — |
| 76 | 300 | 0.25 | 6000~8000 | 0.5 | AM | 1.0 | ⊚ | △ | — |
| 79 | 300 | 2 | 6000~8000 | 0.5 | AM | 1.0 | ⊚ | △ | — |

TABLE G2

(HEC MW is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 2 | 1,200 | 0.05 | 80~120 | 0.005 | AM | 1.0 | ⊚ | △ | — |
| 5 | 1,200 | 0.25 | 80~120 | 0.005 | AM | 1.0 | ⊚ | △ | ⊚ |
| 8 | 1,200 | 2 | 80~120 | 0.005 | AM | 1.0 | ⊚ | △ | — |
| 11 | 1,200 | 0.05 | 150~400 | 0.005 | AM | 1.0 | ⊚ | △ | — |
| 14 | 1,200 | 0.25 | 150~400 | 0.005 | AM | 1.0 | ⊚ | △ | ○ |
| 17 | 1,200 | 2 | 150~400 | 0.005 | AM | 1.0 | ⊚ | △ | — |
| 20 | 1,200 | 0.05 | 6000~8000 | 0.005 | AM | 1.0 | ⊚ | △ | — |
| 23 | 1,200 | 0.25 | 6000~8000 | 0.005 | AM | 1.0 | ⊚ | △ | ⊚ |

TABLE G2-continued (HEC MW is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 26 | 1,200 | 2 | 6000~8000 | 0.005 | AM | 1.0 | ◉ | Δ | — |
| 29 | 1,200 | 0.05 | 80~120 | 0.1 | AM | 1.0 | ◉ | Δ | — |
| 32 | 1,200 | 0.25 | 80~120 | 0.1 | AM | 1.0 | ☆ | Δ | — |
| 35 | 1,200 | 2 | 80~120 | 0.1 | AM | 1.0 | ◉ | Δ | — |
| 38 | 1,200 | 0.05 | 150~400 | 0.1 | AM | 1.0 | ◉ | Δ | — |
| 41 | 1,200 | 0.25 | 150~400 | 0.1 | AM | 1.0 | ☆ | Δ | ◉ |
| 44 | 1,200 | 2 | 150~400 | 0.1 | AM | 1.0 | ◉ | Δ | — |
| 47 | 1,200 | 0.05 | 6000~8000 | 0.1 | AM | 1.0 | ◉ | Δ | ◉ |
| 50 | 1,200 | 0.25 | 6000~8000 | 0.1 | AM | 1.0 | ☆ | Δ | ◉ |
| 53 | 1,200 | 2 | 6000~8000 | 0.1 | AM | 1.0 | ◉ | Δ | ◉ |
| 56 | 1,200 | 0.05 | 80~120 | 0.5 | AM | 1.0 | ◉ | Δ | — |
| 59 | 1,200 | 0.25 | 80~120 | 0.5 | AM | 1.0 | ◉ | Δ | — |
| 62 | 1,200 | 2 | 80~120 | 0.5 | AM | 1.0 | ◉ | Δ | ○ |
| 65 | 1,200 | 0.05 | 150~400 | 0.5 | AM | 1.0 | ◉ | Δ | ◉ |
| 68 | 1,200 | 0.25 | 150~400 | 0.5 | AM | 1.0 | ◉ | Δ | ◉ |
| 71 | 1,200 | 2 | 150~400 | 0.5 | AM | 1.0 | ◉ | Δ | — |
| 74 | 1,200 | 0.05 | 6000~8000 | 0.5 | AM | 1.0 | ◉ | Δ | — |
| 77 | 1,200 | 0.25 | 6000~8000 | 0.5 | AM | 1.0 | ◉ | Δ | — |
| 80 | 1,200 | 2 | 6000~8000 | 0.5 | AM | 1.0 | ◉ | Δ | — |

TABLE G3

(HEC MW is fixed at a high value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 3 | 1,800 | 0.05 | 80~120 | 0.005 | AM | 1.0 | ◉ | Δ | ○ |
| 6 | 1,800 | 0.25 | 80~120 | 0.005 | AM | 1.0 | ◉ | Δ | — |
| 9 | 1,800 | 2 | 80~120 | 0.005 | AM | 1.0 | ◉ | Δ | ○ |
| 12 | 1,800 | 0.05 | 150~400 | 0.005 | AM | 1.0 | ◉ | Δ | — |
| 15 | 1,800 | 0.25 | 150~400 | 0.005 | AM | 1.0 | ◉ | Δ | — |
| 18 | 1,800 | 2 | 150~400 | 0.005 | AM | 1.0 | ◉ | Δ | — |
| 21 | 1,800 | 0.05 | 6000~8000 | 0.005 | AM | 1.0 | ◉ | Δ | — |
| 24 | 1,800 | 0.25 | 6000~8000 | 0.005 | AM | 1.0 | ◉ | Δ | — |
| 27 | 1,800 | 2 | 6000~8000 | 0.005 | AM | 1.0 | ◉ | Δ | ○ |
| 30 | 1,800 | 0.05 | 80~120 | 0.1 | AM | 1.0 | ◉ | Δ | — |
| 33 | 1,800 | 0.25 | 80~120 | 0.1 | AM | 1.0 | ☆ | Δ | — |
| 36 | 1,800 | 2 | 80~120 | 0.1 | AM | 1.0 | ◉ | Δ | — |
| 39 | 1,800 | 0.05 | 150~400 | 0.1 | AM | 1.0 | ◉ | Δ | — |
| 42 | 1,800 | 0.25 | 150~400 | 0.1 | AM | 1.0 | ☆ | Δ | — |
| 45 | 1,800 | 2 | 150~400 | 0.1 | AM | 1.0 | ◉ | Δ | ◉ |
| 48 | 1,800 | 0.05 | 6000~8000 | 0.1 | AM | 1.0 | ◉ | Δ | — |
| 51 | 1,800 | 0.25 | 6000~8000 | 0.1 | AM | 1.0 | ☆ | Δ | — |
| 54 | 1,800 | 2 | 6000~8000 | 0.1 | AM | 1.0 | ◉ | Δ | — |
| 57 | 1,800 | 0.05 | 80~120 | 0.5 | AM | 1.0 | ◉ | Δ | ○ |
| 60 | 1,800 | 0.25 | 80~120 | 0.5 | AM | 1.0 | ◉ | Δ | — |
| 63 | 1,800 | 2 | 80~120 | 0.5 | AM | 1.0 | ◉ | Δ | — |
| 66 | 1,800 | 0.05 | 150~400 | 0.5 | AM | 1.0 | ◉ | Δ | — |
| 69 | 1,800 | 0.25 | 150~400 | 0.5 | AM | 1.0 | ◉ | Δ | — |
| 72 | 1,800 | 2 | 150~400 | 0.5 | AM | 1.0 | ◉ | Δ | ○ |
| 75 | 1,800 | 0.05 | 6000~8000 | 0.5 | AM | 1.0 | ◉ | Δ | ○ |
| 78 | 1,800 | 0.25 | 6000~8000 | 0.5 | AM | 1.0 | ◉ | Δ | — |
| 81 | 1,800 | 2 | 6000~8000 | 0.5 | AM | 1.0 | ◉ | Δ | ○ |

TABLE G4

(HEC wt % is fixed at a low value)

| Example # | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 1 | 300 | 0.05 | 80~120 | 0.005 | AM | 1.0 | ◉ | Δ | ○ |
| 2 | 1,200 | 0.05 | 80~120 | 0.005 | AM | 1.0 | ◉ | Δ | — |
| 3 | 1,800 | 0.05 | 80~120 | 0.005 | AM | 1.0 | ◉ | Δ | ○ |
| 10 | 300 | 0.05 | 150~400 | 0.005 | AM | 1.0 | ◉ | Δ | — |
| 11 | 1,200 | 0.05 | 150~400 | 0.005 | AM | 1.0 | ◉ | Δ | — |
| 12 | 1,800 | 0.05 | 150~400 | 0.005 | AM | 1.0 | ◉ | Δ | — |
| 19 | 300 | 0.05 | 6000~8000 | 0.005 | AM | 1.0 | ◉ | Δ | ○ |

TABLE G4-continued (HEC wt % is fixed at a low value)

| Example # | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 20 | 1,200 | 0.05 | 6000~8000 | 0.005 | AM | 1.0 | ◎ | △ | — |
| 21 | 1,800 | 0.05 | 6000~8000 | 0.005 | AM | 1.0 | ◎ | △ | — |
| 28 | 300 | 0.05 | 80~120 | 0.1 | AM | 1.0 | ◎ | △ | — |
| 29 | 1,200 | 0.05 | 80~120 | 0.1 | AM | 1.0 | ◎ | △ | — |
| 30 | 1,800 | 0.05 | 80~120 | 0.1 | AM | 1.0 | ◎ | △ | — |
| 37 | 300 | 0.05 | 150~400 | 0.1 | AM | 1.0 | ◎ | △ | ◎ |
| 38 | 1,200 | 0.05 | 150~400 | 0.1 | AM | 1.0 | ◎ | △ | — |
| 39 | 1,800 | 0.05 | 150~400 | 0.1 | AM | 1.0 | ◎ | △ | — |
| 46 | 300 | 0.05 | 6000~8000 | 0.1 | AM | 1.0 | ◎ | △ | — |
| 47 | 1,200 | 0.05 | 6000~8000 | 0.1 | AM | 1.0 | ◎ | △ | ◎ |
| 48 | 1,800 | 0.05 | 6000~8000 | 0.1 | AM | 1.0 | ◎ | △ | — |
| 55 | 300 | 0.05 | 80~120 | 0.5 | AM | 1.0 | ◎ | △ | — |
| 56 | 1,200 | 0.05 | 80~120 | 0.5 | AM | 1.0 | ◎ | △ | — |
| 57 | 1,800 | 0.05 | 80~120 | 0.5 | AM | 1.0 | ◎ | △ | ○ |
| 64 | 300 | 0.05 | 150~400 | 0.5 | AM | 1.0 | ◎ | △ | — |
| 65 | 1,200 | 0.05 | 150~400 | 0.5 | AM | 1.0 | ◎ | △ | ◎ |
| 66 | 1,800 | 0.05 | 150~400 | 0.5 | AM | 1.0 | ◎ | △ | — |
| 73 | 300 | 0.05 | 6000~8000 | 0.5 | AM | 1.0 | ◎ | △ | — |
| 74 | 1,200 | 0.05 | 6000~8000 | 0.5 | AM | 1.0 | ◎ | △ | — |
| 75 | 1,800 | 0.05 | 6000~8000 | 0.5 | AM | 1.0 | ◎ | △ | ○ |

TABLE G5

(HEC wt % is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 4 | 300 | 0.25 | 80~120 | 0.005 | AM | 1.0 | ◎ | △ | — |
| 5 | 1,200 | 0.25 | 80~120 | 0.005 | AM | 1.0 | ◎ | △ | ◎ |
| 6 | 1,800 | 0.25 | 80~120 | 0.005 | AM | 1.0 | ◎ | △ | — |
| 13 | 300 | 0.25 | 150~400 | 0.005 | AM | 1.0 | ◎ | △ | — |
| 14 | 1,200 | 0.25 | 150~400 | 0.005 | AM | 1.0 | ◎ | △ | ○ |
| 15 | 1,800 | 0.25 | 150~400 | 0.005 | AM | 1.0 | ◎ | △ | — |
| 22 | 300 | 0.25 | 6000~8000 | 0.005 | AM | 1.0 | ◎ | △ | — |
| 23 | 1,200 | 0.25 | 6000~8000 | 0.005 | AM | 1.0 | ◎ | △ | ◎ |
| 24 | 1,800 | 0.25 | 6000~8000 | 0.005 | AM | 1.0 | ◎ | △ | — |
| 31 | 300 | 0.25 | 80~120 | 0.1 | AM | 1.0 | ☆ | △ | ◎ |
| 32 | 1,200 | 0.25 | 80~120 | 0.1 | AM | 1.0 | ☆ | △ | — |
| 33 | 1,800 | 0.25 | 80~120 | 0.1 | AM | 1.0 | ☆ | △ | — |
| 40 | 300 | 0.25 | 150~400 | 0.1 | AM | 1.0 | ☆ | △ | — |
| 41 | 1,200 | 0.25 | 150~400 | 0.1 | AM | 1.0 | ☆ | △ | ◎ |
| 42 | 1,800 | 0.25 | 150~400 | 0.1 | AM | 1.0 | ☆ | △ | — |
| 49 | 300 | 0.25 | 6000~8000 | 0.1 | AM | 1.0 | ☆ | △ | — |
| 50 | 1,200 | 0.25 | 6000~8000 | 0.1 | AM | 1.0 | ☆ | △ | ◎ |
| 51 | 1,800 | 0.25 | 6000~8000 | 0.1 | AM | 1.0 | ☆ | △ | — |
| 58 | 300 | 0.25 | 80~120 | 0.5 | AM | 1.0 | ◎ | △ | ○ |
| 59 | 1,200 | 0.25 | 80~120 | 0.5 | AM | 1.0 | ◎ | △ | — |
| 60 | 1,800 | 0.25 | 80~120 | 0.5 | AM | 1.0 | ◎ | △ | — |
| 67 | 300 | 0.25 | 150~400 | 0.5 | AM | 1.0 | ◎ | △ | — |
| 68 | 1,200 | 0.25 | 150~400 | 0.5 | AM | 1.0 | ◎ | △ | ◎ |
| 69 | 1,800 | 0.25 | 150~400 | 0.5 | AM | 1.0 | ◎ | △ | — |
| 76 | 300 | 0.25 | 6000~8000 | 0.5 | AM | 1.0 | ◎ | △ | — |
| 77 | 1,200 | 0.25 | 6000~8000 | 0.5 | AM | 1.0 | ◎ | △ | — |
| 78 | 1,800 | 0.25 | 6000~8000 | 0.5 | AM | 1.0 | ◎ | △ | — |

TABLE G6

(HEC wt % is fixed at a high value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 7 | 300 | 2 | 80~120 | 0.005 | AM | 1.0 | ◎ | △ | — |
| 8 | 1,200 | 2 | 80~120 | 0.005 | AM | 1.0 | ◎ | △ | — |
| 9 | 1,800 | 2 | 80~120 | 0.005 | AM | 1.0 | ◎ | △ | ○ |
| 16 | 300 | 2 | 150~400 | 0.005 | AM | 1.0 | ◎ | △ | ○ |
| 17 | 1,200 | 2 | 150~400 | 0.005 | AM | 1.0 | ◎ | △ | — |
| 18 | 1,800 | 2 | 150~400 | 0.005 | AM | 1.0 | ◎ | △ | — |

TABLE G6-continued (HEC wt % is fixed at a high value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 25 | 300 | 2 | 6000~8000 | 0.005 | AM | 1.0 | ◉ | Δ | — |
| 26 | 1,200 | 2 | 6000~8000 | 0.005 | AM | 1.0 | ◉ | Δ | — |
| 27 | 1,800 | 2 | 6000~8000 | 0.005 | AM | 1.0 | ◉ | Δ | ○ |
| 34 | 300 | 2 | 80~120 | 0.1 | AM | 1.0 | ◉ | Δ | — |
| 35 | 1,200 | 2 | 80~120 | 0.1 | AM | 1.0 | ◉ | Δ | — |
| 36 | 1,800 | 2 | 80~120 | 0.1 | AM | 1.0 | ◉ | Δ | — |
| 43 | 300 | 2 | 150~400 | 0.1 | AM | 1.0 | ◉ | Δ | — |
| 44 | 1,200 | 2 | 150~400 | 0.1 | AM | 1.0 | ◉ | Δ | — |
| 45 | 1,800 | 2 | 150~400 | 0.1 | AM | 1.0 | ◉ | Δ | ◉ |
| 52 | 300 | 2 | 6000~8000 | 0.1 | AM | 1.0 | ◉ | Δ | — |
| 53 | 1,200 | 2 | 6000~8000 | 0.1 | AM | 1.0 | ◉ | Δ | ◉ |
| 54 | 1,800 | 2 | 6000~8000 | 0.1 | AM | 1.0 | ◉ | Δ | — |
| 61 | 300 | 2 | 80~120 | 0.5 | AM | 1.0 | ◉ | Δ | — |
| 62 | 1,200 | 2 | 80~120 | 0.5 | AM | 1.0 | ◉ | Δ | ○ |
| 63 | 1,800 | 2 | 80~120 | 0.5 | AM | 1.0 | ◉ | Δ | — |
| 70 | 300 | 2 | 150~400 | 0.5 | AM | 1.0 | ◉ | Δ | — |
| 71 | 1,200 | 2 | 150~400 | 0.5 | AM | 1.0 | ◉ | Δ | — |
| 72 | 1,800 | 2 | 150~400 | 0.5 | AM | 1.0 | ◉ | Δ | ○ |
| 79 | 300 | 2 | 6000~8000 | 0.5 | AM | 1.0 | ◉ | Δ | — |
| 80 | 1,200 | 2 | 6000~8000 | 0.5 | AM | 1.0 | ◉ | Δ | — |
| 81 | 1,800 | 2 | 6000~8000 | 0.5 | AM | 1.0 | ◉ | Δ | ○ |

TABLE G7

(PEO MW is fixed at a low value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 1 | 300 | 0.05 | 80~120 | 0.005 | AM | 1.0 | ◉ | Δ | ○ |
| 2 | 1,200 | 0.05 | 80~120 | 0.005 | AM | 1.0 | ◉ | Δ | — |
| 3 | 1,800 | 0.05 | 80~120 | 0.005 | AM | 1.0 | ◉ | Δ | ○ |
| 4 | 300 | 0.25 | 80~120 | 0.005 | AM | 1.0 | ◉ | Δ | — |
| 5 | 1,200 | 0.25 | 80~120 | 0.005 | AM | 1.0 | ◉ | Δ | ◉ |
| 6 | 1,800 | 0.25 | 80~120 | 0.005 | AM | 1.0 | ◉ | Δ | — |
| 7 | 300 | 2 | 80~120 | 0.005 | AM | 1.0 | ◉ | Δ | — |
| 8 | 1,200 | 2 | 80~120 | 0.005 | AM | 1.0 | ◉ | Δ | — |
| 9 | 1,800 | 2 | 80~120 | 0.005 | AM | 1.0 | ◉ | Δ | ○ |
| 28 | 300 | 0.05 | 80~120 | 0.1 | AM | 1.0 | ◉ | Δ | — |
| 29 | 1,200 | 0.05 | 80~120 | 0.1 | AM | 1.0 | ◉ | Δ | — |
| 30 | 1,800 | 0.05 | 80~120 | 0.1 | AM | 1.0 | ◉ | Δ | — |
| 31 | 300 | 0.25 | 80~120 | 0.1 | AM | 1.0 | ☆ | Δ | ◉ |
| 32 | 1,200 | 0.25 | 80~120 | 0.1 | AM | 1.0 | ☆ | Δ | — |
| 33 | 1,800 | 0.25 | 80~120 | 0.1 | AM | 1.0 | ☆ | Δ | — |
| 34 | 300 | 2 | 80~120 | 0.1 | AM | 1.0 | ◉ | Δ | — |
| 35 | 1,200 | 2 | 80~120 | 0.1 | AM | 1.0 | ◉ | Δ | — |
| 36 | 1,800 | 2 | 80~120 | 0.1 | AM | 1.0 | ◉ | Δ | — |
| 55 | 300 | 0.05 | 80~120 | 0.5 | AM | 1.0 | ◉ | Δ | — |
| 56 | 1,200 | 0.05 | 80~120 | 0.5 | AM | 1.0 | ◉ | Δ | — |
| 57 | 1,800 | 0.05 | 80~120 | 0.5 | AM | 1.0 | ◉ | Δ | ○ |
| 58 | 300 | 0.25 | 80~120 | 0.5 | AM | 1.0 | ◉ | Δ | ○ |
| 59 | 1,200 | 0.25 | 80~120 | 0.5 | AM | 1.0 | ◉ | Δ | — |
| 60 | 1,800 | 0.25 | 80~120 | 0.5 | AM | 1.0 | ◉ | Δ | — |
| 61 | 300 | 2 | 80~120 | 0.5 | AM | 1.0 | ◉ | Δ | — |
| 62 | 1,200 | 2 | 80~120 | 0.5 | AM | 1.0 | ◉ | Δ | ○ |
| 63 | 1,800 | 2 | 80~120 | 0.5 | AM | 1.0 | ◉ | Δ | — |

TABLE G8

(PEO MW is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 10 | 300 | 0.05 | 150~400 | 0.005 | AM | 1.0 | ◉ | Δ | — |
| 11 | 1,200 | 0.05 | 150~400 | 0.005 | AM | 1.0 | ◉ | Δ | — |
| 12 | 1,800 | 0.05 | 150~400 | 0.005 | AM | 1.0 | ◉ | Δ | — |
| 13 | 300 | 0.25 | 150~400 | 0.005 | AM | 1.0 | ◉ | Δ | — |
| 14 | 1,200 | 0.25 | 150~400 | 0.005 | AM | 1.0 | ◉ | Δ | ○ |

TABLE G8-continued (PEO MW is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 15 | 1,800 | 0.25 | 150~400 | 0.005 | AM | 1.0 | ◎ | △ | — |
| 16 | 300 | 2 | 150~400 | 0.005 | AM | 1.0 | ◎ | △ | ○ |
| 17 | 1,200 | 2 | 150~400 | 0.005 | AM | 1.0 | ◎ | △ | — |
| 18 | 1,800 | 2 | 150~400 | 0.005 | AM | 1.0 | ◎ | △ | — |
| 37 | 300 | 0.05 | 150~400 | 0.1 | AM | 1.0 | ◎ | △ | ◎ |
| 38 | 1,200 | 0.05 | 150~400 | 0.1 | AM | 1.0 | ◎ | △ | — |
| 39 | 1,800 | 0.05 | 150~400 | 0.1 | AM | 1.0 | ◎ | △ | — |
| 40 | 300 | 0.25 | 150~400 | 0.1 | AM | 1.0 | ☆ | △ | — |
| 41 | 1,200 | 0.25 | 150~400 | 0.1 | AM | 1.0 | ☆ | △ | ◎ |
| 42 | 1,800 | 0.25 | 150~400 | 0.1 | AM | 1.0 | ☆ | △ | — |
| 43 | 300 | 2 | 150~400 | 0.1 | AM | 1.0 | ◎ | △ | — |
| 44 | 1,200 | 2 | 150~400 | 0.1 | AM | 1.0 | ◎ | △ | — |
| 45 | 1,800 | 2 | 150~400 | 0.1 | AM | 1.0 | ◎ | △ | ◎ |
| 64 | 300 | 0.05 | 150~400 | 0.5 | AM | 1.0 | ◎ | △ | — |
| 65 | 1,200 | 0.05 | 150~400 | 0.5 | AM | 1.0 | ◎ | △ | ◎ |
| 66 | 1,800 | 0.05 | 150~400 | 0.5 | AM | 1.0 | ◎ | △ | — |
| 67 | 300 | 0.25 | 150~400 | 0.5 | AM | 1.0 | ◎ | △ | — |
| 68 | 1,200 | 0.25 | 150~400 | 0.5 | AM | 1.0 | ◎ | △ | ◎ |
| 69 | 1,800 | 0.25 | 150~400 | 0.5 | AM | 1.0 | ◎ | △ | — |
| 70 | 300 | 2 | 150~400 | 0.5 | AM | 1.0 | ◎ | △ | — |
| 71 | 1,200 | 2 | 150~400 | 0.5 | AM | 1.0 | ◎ | △ | — |
| 72 | 1,800 | 2 | 150~400 | 0.5 | AM | 1.0 | ◎ | △ | ○ |

TABLE G9

(PEO MW is fixed at a high value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 19 | 300 | 0.05 | 6000~8000 | 0.005 | AM | 1.0 | ◎ | △ | ○ |
| 20 | 1,200 | 0.05 | 6000~8000 | 0.005 | AM | 1.0 | ◎ | △ | — |
| 21 | 1,800 | 0.05 | 6000~8000 | 0.005 | AM | 1.0 | ◎ | △ | — |
| 22 | 300 | 0.25 | 6000~8000 | 0.005 | AM | 1.0 | ◎ | △ | — |
| 23 | 1,200 | 0.25 | 6000~8000 | 0.005 | AM | 1.0 | ◎ | △ | ◎ |
| 24 | 1,800 | 0.25 | 6000~8000 | 0.005 | AM | 1.0 | ◎ | △ | — |
| 25 | 300 | 2 | 6000~8000 | 0.005 | AM | 1.0 | ◎ | △ | — |
| 26 | 1,200 | 2 | 6000~8000 | 0.005 | AM | 1.0 | ◎ | △ | — |
| 27 | 1,800 | 2 | 6000~8000 | 0.005 | AM | 1.0 | ◎ | △ | ○ |
| 46 | 300 | 0.05 | 6000~8000 | 0.1 | AM | 1.0 | ◎ | △ | — |
| 47 | 1,200 | 0.05 | 6000~8000 | 0.1 | AM | 1.0 | ◎ | △ | ◎ |
| 48 | 1,800 | 0.05 | 6000~8000 | 0.1 | AM | 1.0 | ◎ | △ | — |
| 49 | 300 | 0.25 | 6000~8000 | 0.1 | AM | 1.0 | ☆ | △ | — |
| 50 | 1,200 | 0.25 | 6000~8000 | 0.1 | AM | 1.0 | ☆ | △ | ◎ |
| 51 | 1,800 | 0.25 | 6000~8000 | 0.1 | AM | 1.0 | ☆ | △ | — |
| 52 | 300 | 2 | 6000~8000 | 0.1 | AM | 1.0 | ◎ | △ | — |
| 53 | 1,200 | 2 | 6000~8000 | 0.1 | AM | 1.0 | ◎ | △ | ◎ |
| 54 | 1,800 | 2 | 6000~8000 | 0.1 | AM | 1.0 | ◎ | △ | — |
| 73 | 300 | 0.05 | 6000~8000 | 0.5 | AM | 1.0 | ◎ | △ | — |
| 74 | 1,200 | 0.05 | 6000~8000 | 0.5 | AM | 1.0 | ◎ | △ | — |
| 75 | 1,800 | 0.05 | 6000~8000 | 0.5 | AM | 1.0 | ◎ | △ | ○ |
| 76 | 300 | 0.25 | 6000~8000 | 0.5 | AM | 1.0 | ◎ | △ | — |
| 77 | 1,200 | 0.25 | 6000~8000 | 0.5 | AM | 1.0 | ◎ | △ | — |
| 78 | 1,800 | 0.25 | 6000~8000 | 0.5 | AM | 1.0 | ◎ | △ | — |
| 79 | 300 | 2 | 6000~8000 | 0.5 | AM | 1.0 | ◎ | △ | — |
| 80 | 1,200 | 2 | 6000~8000 | 0.5 | AM | 1.0 | ◎ | △ | — |
| 81 | 1,800 | 2 | 6000~8000 | 0.5 | AM | 1.0 | ◎ | △ | ○ |

TABLE G10

(PEO wt % is fixed at a low end value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 1 | 300 | 0.05 | 80~120 | 0.005 | AM | 1.0 | ◎ | △ | ○ |
| 2 | 1,200 | 0.05 | 80~120 | 0.005 | AM | 1.0 | ◎ | △ | — |
| 3 | 1,800 | 0.05 | 80~120 | 0.005 | AM | 1.0 | ◎ | △ | ○ |
| 4 | 300 | 0.25 | 80~120 | 0.005 | AM | 1.0 | ◎ | △ | — |

TABLE G10-continued (PEO wt % is fixed at a low end value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 5 | 1,200 | 0.25 | 80~120 | 0.005 | AM | 1.0 | ⊚ | △ | ⊚ |
| 6 | 1,800 | 0.25 | 80~120 | 0.005 | AM | 1.0 | ⊚ | △ | — |
| 7 | 300 | 2 | 80~120 | 0.005 | AM | 1.0 | ⊚ | △ | — |
| 8 | 1,200 | 2 | 80~120 | 0.005 | AM | 1.0 | ⊚ | △ | — |
| 9 | 1,800 | 2 | 80~120 | 0.005 | AM | 1.0 | ⊚ | △ | ○ |
| 10 | 300 | 0.05 | 150~400 | 0.005 | AM | 1.0 | ⊚ | △ | — |
| 11 | 1,200 | 0.05 | 150~400 | 0.005 | AM | 1.0 | ⊚ | △ | — |
| 12 | 1,800 | 0.05 | 150~400 | 0.005 | AM | 1.0 | ⊚ | △ | — |
| 13 | 300 | 0.25 | 150~400 | 0.005 | AM | 1.0 | ⊚ | △ | — |
| 14 | 1,200 | 0.25 | 150~400 | 0.005 | AM | 1.0 | ⊚ | △ | ○ |
| 15 | 1,800 | 0.25 | 150~400 | 0.005 | AM | 1.0 | ⊚ | △ | — |
| 16 | 300 | 2 | 150~400 | 0.005 | AM | 1.0 | ⊚ | △ | ○ |
| 17 | 1,200 | 2 | 150~400 | 0.005 | AM | 1.0 | ⊚ | △ | — |
| 18 | 1,800 | 2 | 150~400 | 0.005 | AM | 1.0 | ⊚ | △ | — |
| 19 | 300 | 0.05 | 6000~8000 | 0.005 | AM | 1.0 | ⊚ | △ | ○ |
| 20 | 1,200 | 0.05 | 6000~8000 | 0.005 | AM | 1.0 | ⊚ | △ | — |
| 21 | 1,800 | 0.05 | 6000~8000 | 0.005 | AM | 1.0 | ⊚ | △ | — |
| 22 | 300 | 0.25 | 6000~8000 | 0.005 | AM | 1.0 | ⊚ | △ | — |
| 23 | 1,200 | 0.25 | 6000~8000 | 0.005 | AM | 1.0 | ⊚ | △ | ⊚ |
| 24 | 1,800 | 0.25 | 6000~8000 | 0.005 | AM | 1.0 | ⊚ | △ | — |
| 25 | 300 | 2 | 6000~8000 | 0.005 | AM | 1.0 | ⊚ | △ | — |
| 26 | 1,200 | 2 | 6000~8000 | 0.005 | AM | 1.0 | ⊚ | △ | — |
| 27 | 1,800 | 2 | 6000~8000 | 0.005 | AM | 1.0 | ⊚ | △ | ○ |

TABLE G11

(PEO wt % is fixed at a mid range value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 28 | 300 | 0.05 | 80~120 | 0.1 | AM | 1.0 | ⊚ | △ | — |
| 29 | 1,200 | 0.05 | 80~120 | 0.1 | AM | 1.0 | ⊚ | △ | — |
| 30 | 1,800 | 0.05 | 80~120 | 0.1 | AM | 1.0 | ⊚ | △ | — |
| 31 | 300 | 0.25 | 80~120 | 0.1 | AM | 1.0 | ☆ | △ | ⊚ |
| 32 | 1,200 | 0.25 | 80~120 | 0.1 | AM | 1.0 | ☆ | △ | — |
| 33 | 1,800 | 0.25 | 80~120 | 0.1 | AM | 1.0 | ☆ | △ | — |
| 34 | 300 | 2 | 80~120 | 0.1 | AM | 1.0 | ⊚ | △ | — |
| 35 | 1,200 | 2 | 80~120 | 0.1 | AM | 1.0 | ⊚ | △ | — |
| 36 | 1,800 | 2 | 80~120 | 0.1 | AM | 1.0 | ⊚ | △ | — |
| 37 | 300 | 0.05 | 150~400 | 0.1 | AM | 1.0 | ⊚ | △ | ⊚ |
| 38 | 1,200 | 0.05 | 150~400 | 0.1 | AM | 1.0 | ⊚ | △ | — |
| 39 | 1,800 | 0.05 | 150~400 | 0.1 | AM | 1.0 | ⊚ | △ | — |
| 40 | 300 | 0.25 | 150~400 | 0.1 | AM | 1.0 | ☆ | △ | — |
| 41 | 1,200 | 0.25 | 150~400 | 0.1 | AM | 1.0 | ☆ | △ | ⊚ |
| 42 | 1,800 | 0.25 | 150~400 | 0.1 | AM | 1.0 | ☆ | △ | — |
| 43 | 300 | 2 | 150~400 | 0.1 | AM | 1.0 | ⊚ | △ | — |
| 44 | 1,200 | 2 | 150~400 | 0.1 | AM | 1.0 | ⊚ | △ | — |
| 45 | 1,800 | 2 | 150~400 | 0.1 | AM | 1.0 | ⊚ | △ | ⊚ |
| 46 | 300 | 0.05 | 6000~8000 | 0.1 | AM | 1.0 | ⊚ | △ | — |
| 47 | 1,200 | 0.05 | 6000~8000 | 0.1 | AM | 1.0 | ⊚ | △ | ⊚ |
| 48 | 1,800 | 0.05 | 6000~8000 | 0.1 | AM | 1.0 | ⊚ | △ | — |
| 49 | 300 | 0.25 | 6000~8000 | 0.1 | AM | 1.0 | ☆ | △ | — |
| 50 | 1,200 | 0.25 | 6000~8000 | 0.1 | AM | 1.0 | ☆ | △ | ⊚ |
| 51 | 1,800 | 0.25 | 6000~8000 | 0.1 | AM | 1.0 | ☆ | △ | — |
| 52 | 300 | 2 | 6000~8000 | 0.1 | AM | 1.0 | ⊚ | △ | — |
| 53 | 1,200 | 2 | 6000~8000 | 0.1 | AM | 1.0 | ⊚ | △ | ⊚ |
| 54 | 1,800 | 2 | 6000~8000 | 0.1 | AM | 1.0 | ⊚ | △ | — |

TABLE G12

(PEO wt % is fixed at a high end value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 55 | 300 | 0.05 | 80~120 | 0.5 | AM | 1.0 | ⊚ | △ | — |
| 56 | 1,200 | 0.05 | 80~120 | 0.5 | AM | 1.0 | ⊚ | △ | — |
| 57 | 1,800 | 0.05 | 80~120 | 0.5 | AM | 1.0 | ⊚ | △ | ○ |

TABLE G12-continued (PEO wt % is fixed at a high end value)

| Example# | HEC MW (×10³) | HEC wt % | PEO MW (×10³) | PEO wt % | Alkaline | Alkaline wt % | Haze Level | LPD | Surface Condition |
|---|---|---|---|---|---|---|---|---|---|
| 58 | 300 | 0.25 | 80~120 | 0.5 | AM | 1.0 | ◉ | Δ | ○ |
| 59 | 1,200 | 0.25 | 80~120 | 0.5 | AM | 1.0 | ◉ | Δ | — |
| 60 | 1,800 | 0.25 | 80~120 | 0.5 | AM | 1.0 | ◉ | Δ | — |
| 61 | 300 | 2 | 80~120 | 0.5 | AM | 1.0 | ◉ | Δ | — |
| 62 | 1,200 | 2 | 80~120 | 0.5 | AM | 1.0 | ◉ | Δ | ○ |
| 63 | 1,800 | 2 | 80~120 | 0.5 | AM | 1.0 | ◉ | Δ | — |
| 64 | 300 | 0.05 | 150~400 | 0.5 | AM | 1.0 | ◉ | Δ | — |
| 65 | 1,200 | 0.05 | 150~400 | 0.5 | AM | 1.0 | ◉ | Δ | ◉ |
| 66 | 1,800 | 0.05 | 150~400 | 0.5 | AM | 1.0 | ◉ | Δ | — |
| 67 | 300 | 0.25 | 150~400 | 0.5 | AM | 1.0 | ◉ | Δ | — |
| 68 | 1,200 | 0.25 | 150~400 | 0.5 | AM | 1.0 | ◉ | Δ | ◉ |
| 69 | 1,800 | 0.25 | 150~400 | 0.5 | AM | 1.0 | ◉ | Δ | — |
| 70 | 300 | 2 | 150~400 | 0.5 | AM | 1.0 | ◉ | Δ | — |
| 71 | 1,200 | 2 | 150~400 | 0.5 | AM | 1.0 | ◉ | Δ | — |
| 72 | 1,800 | 2 | 150~400 | 0.5 | AM | 1.0 | ◉ | Δ | ○ |
| 73 | 300 | 0.05 | 6000~8000 | 0.5 | AM | 1.0 | ◉ | Δ | — |
| 74 | 1,200 | 0.05 | 6000~8000 | 0.5 | AM | 1.0 | ◉ | Δ | — |
| 75 | 1,800 | 0.05 | 6000~8000 | 0.5 | AM | 1.0 | ◉ | Δ | ○ |
| 76 | 300 | 0.25 | 6000~8000 | 0.5 | AM | 1.0 | ◉ | Δ | — |
| 77 | 1,200 | 0.25 | 6000~8000 | 0.5 | AM | 1.0 | ◉ | Δ | — |
| 78 | 1,800 | 0.25 | 6000~8000 | 0.5 | AM | 1.0 | ◉ | Δ | — |
| 79 | 300 | 2 | 6000~8000 | 0.5 | AM | 1.0 | ◉ | Δ | — |
| 80 | 1,200 | 2 | 6000~8000 | 0.5 | AM | 1.0 | ◉ | Δ | — |
| 81 | 1,800 | 2 | 6000~8000 | 0.5 | AM | 1.0 | ◉ | Δ | ○ |

HEC weight % is controlled for in a range of between 0.05% and 2% by weight in Tables E, G-4, G-5, G-6, and H which provide sufficient representative data to show that HEC within this range displays unexpected synergistic effects. These tables show that at both of the endpoints and within this range of HEC with a number of different PEO and ammonia combinations, unexpected synergistic effects occur. In addition, line 8 in Table H shows that HEC below this range does not display unexpected synergistic effects.

HEC molecular weight is controlled for in a range of between 300,000 and 2,000,000. Tables E, G-1, G-2, G-3, and H provide sufficient representative data to show that HEC within this range displays unexpected synergistic effects. These tables show that at both of the endpoints and within this range of HEC with a number of PEO and ammonia combinations, unexpected synergistic effects occur. In addition, line 6 in Table H shows that HEC below this range does not displays unexpected synergistic effects.

TABLE H

| Supplemental Example# | HEC MW (×10³) | HEC wt % | PEO MW (×10³) | PEO wt % | Alkaline | Alkaline wt % | Haze level | LPD | Surface Condition |
|---|---|---|---|---|---|---|---|---|---|
| 1 | 1200 | 0.25 | 150~400 | 0.1 | AM | 1 | ☆ | Δ | ◉ |
| 2 | 1200 | 0.25 | 150~400 | 0.1 | AM | 0.01 | Δ | Δ | — |
| 3 | 1200 | 0.25 | 150~400 | 0.1 | AM | 0.02 | ◉ | Δ | — |
| 4 | 1200 | 0.25 | 150~400 | 0.1 | AM | 4 | ◉ | Δ | — |
| 5 | 1200 | 0.25 | 150~400 | 0.1 | AM | 4.5 | ○ | Δ | — |
| 6 | 200 | 0.25 | 150~400 | 0.1 | AM | 1 | ○ | Δ | — |
| 7* | >2000 | 0.25 | 150~400 | 0.1 | AM | 1 | N/A | N/A | N/A |
| 8 | 1200 | 0.03 | 150~400 | 0.1 | AM | 1 | Δ | Δ | — |
| 9 | 1200 | 2.5 | 150~400 | 0.1 | AM | 1 | Δ | Δ | — |
| 10 | 1200 | 0.25 | 20~40 | 0.1 | AM | 1 | ○ | Δ | — |
| 11 | 1200 | 0.25 | 12,000~14,000 | 0.1 | AM | 1 | Δ | Δ | — |
| 12 | 1200 | 0.25 | 150~400 | 0.003 | AM | 1 | ○ | Δ | — |
| 13 | 1200 | 0.25 | 150~400 | 0.8 | AM | 1 | Δ | Δ | — |

*Example 7 could not be carried out because the applicant does not have HEC having Mw exceeding 2,000,000 on hand PEO weight % is controlled for in a range of between 0.005% and 0.5% by weight. Tables E, G-10, G-11, G-12, and H provide sufficient representative data to show that HEC within this range displays unexpected synergistic effects. These tables show that at both of the endpoints and within this range of PEO with a number of different HEC and ammonia combinations, unexpected synergistic effects occur. In addition lines 10 and 11 in Table H show that PEO below this range does not display unexpected synergistic effects.

PEO molecular weight is controlled for in a range of between 50,000 and 10,000000. Tables E, G7, G-8, G-9, and H provide sufficient representative data to show that HEC within this range displays unexpected synergistic effects. These tables specifically show that when PEO having a molecular weight between 80,000 and 8,000,000 is with a number of HEC and ammonia combinations, unexpected synergistic effects occur. The provided data represents almost 80% of this range and is sufficient to extrapolate the full breadth of this range. In addition, line 10 in table H shows that below this range synergistic effects occur and line 11 in Table H shows that above this range no synergistic effects occur.

The present examples and embodiments are to be considered as illustrative and not restrictive, and the invention is not to be limited to the details given herein, but may be modified within the scope and equivalence of the appended claims.

The invention claimed is:

1. A method of treating a silicon wafer surface of a silicon wafer for reducing haze level of the silicon wafer surface, said method comprising:
feeding on the silicon wafer surface a polishing composition consisting essentially of hydroxyethyl cellulose, polyethylene oxide, an alkaline compound, water, and silicon dioxide, wherein said polyethylene oxide is compounded in said polishing composition in a quantity larger than 0.005% by weight and smaller than 0.5% by weight; and
polishing the silicon wafer surface using the polishing composition to reduce haze level of the silicon wafer surface.

2. The method according to claim 1, wherein said polishing step includes polishing the silicon wafer surface with a polishing pad.

3. The method according to claim 1, wherein:
hydroxyethyl cellulose is compounded in said polishing composition in a quantity of 0.05 to 2% by weight and having an average molecular weight in the range of 300,000 to 2,000,000;
polyethylene oxide is compounded in said polishing composition in a quantity larger than 0.005% by weight and smaller than 0.5% by weight and having an average molecular weight in the range of 50,000 to 10,000,000; and
the alkaline compound is ammonia compounded in said polishing composition in a quantity 0.02 to 4% by weight.

4. The method according to claim 1, further comprising:
rinsing the silicon wafer surface using a rinse composition immediately after the completion of said polishing step, wherein said rinse composition contains hydroxyethyl cellulose, polyethylene oxide, an alkaline compound, and water, wherein the polyethylene oxide compounded in said rinse composition is in a quantity larger than 0.005% by weight and smaller than 0.5% by weight.

5. The method according to claim 4, wherein said rinse composition has a pH that is substantially equal to the pH of the polishing composition.

6. The method according to claim 4, wherein said rinsing step includes:
feeding the rinse composition on the silicon wafer surface thereby mixing the rinse composition with the polishing composition remaining on the silicon wafer surface; and
polishing with the polishing pad the silicon wafer surface on which a mixture of the rinse composition and the polishing composition is remained.

7. The method according to claim 6, wherein the polishing is performed for a polishing period and the rinsing step is performed for a rinse period shorter than the polishing period.

8. The method according to claim 4, wherein the content of hydroxyethyl cellulose in the rinse composition is 0.01 to 3% by weight.

9. The method according to claim 4, wherein the content of hydroxyethyl cellulose in the rinse composition is 0.05 to 2% by weight.

10. The method according to claim 4, wherein the average molecular weight of hydroxyethyl cellulose in the rinse composition is 300,000 to 2,000,000.

11. The method according to claim 4, wherein the average molecular weight of hydroxyethyl cellulose in the rinse composition is 600,000 to 2,000,000.

12. The method according to claim 4, wherein the content of polyethylene oxide in the rinse composition is larger than 0.01% by weight and smaller than 0.4% by weight.

13. The method according to claim 4, wherein the average molecular weight of polyethylene oxide in the rinse composition is 30,000 to 50,000,000.

14. The method according to claim 4, wherein the average molecular weight of polyethylene oxide in the rinse composition is 50,000 to 10,000,000.

15. The method according to claim 4, wherein the average molecular weight of polyethylene oxide in the rinse composition is 100,000 to 10,000,000.

16. The method according to claim 4, wherein the amount of the alkaline compound in the rinse composition is 0.02 to 4% by weight.

17. The method according to claim 4, wherein the amount of the alkaline compound in the rinse composition is 0.03 to 3% by weight.

18. The method according to claim 4, wherein the alkaline compound is at least one compound selected from the group consisting of ammonia, potassium hydroxide, tetramethyl ammonium hydroxide, and piperazine anhydride.

19. The method according to claim 4, which is used in a rinsing step immediately after a polishing step for reducing the haze level of the silicon wafer surface.

20. The method according to claim 19, wherein the alkaline compound adjusts pH of the rinse composition not to form a gel when the rinse composition is mixed with a polishing composition used in the polishing step.

* * * * *